United States Patent [19]

Sotokawa et al.

[11] Patent Number: 5,272,247
[45] Date of Patent: Dec. 21, 1993

[54] POLYIMIDE PRECURSOR, CURED PRODUCT THEREOF, AND PROCESSES FOR PRODUCING THEM

[75] Inventors: Hideo Sotokawa; Fusaji Shoji; Fumio Kataoka, all of Yokohama; Hidetaka Satou, Hitachi, all of Japan

[73] Assignee: Hitachi, Ltd., Tokyo, Japan

[21] Appl. No.: 779,986

[22] Filed: Oct. 21, 1991

[30] Foreign Application Priority Data

Oct. 19, 1990 [JP] Japan .................. 2-279072
Sep. 5, 1991 [JP] Japan .................. 3-225634

[51] Int. Cl.$^5$ .................. C08G 69/26; C08G 73/10
[52] U.S. Cl. .................. 528/353; 528/125; 528/128; 528/170; 528/172; 528/173; 528/176; 528/183; 528/185; 528/188; 528/220; 528/229; 528/322; 528/342; 528/345; 528/350; 528/351
[58] Field of Search .............. 528/353, 350, 351, 220, 528/229, 322, 342, 345, 183, 185, 188, 176, 170, 172, 173, 125, 128

[56] References Cited

FOREIGN PATENT DOCUMENTS

| | | |
|---|---|---|
| 57-114258 | 7/1982 | Japan . |
| 57-188853 | 11/1982 | Japan . |
| 60-221426 | 11/1985 | Japan . |
| 60-250031 | 12/1985 | Japan . |
| 62-231935 | 10/1987 | Japan . |
| 62-231936 | 10/1987 | Japan . |
| 62-231937 | 10/1987 | Japan . |
| 62-265327 | 11/1987 | Japan . |
| 63-10629 | 1/1988 | Japan . |
| 2-60934 | 3/1990 | Japan . |
| 2-86624 | 3/1990 | Japan . |

Primary Examiner—John Kight, III
Assistant Examiner—P. Hampton-Hightower
Attorney, Agent, or Firm—Antonelli, Terry, Stout & Kraus

[57] ABSTRACT

The present invention provides a polyimide having all of small dielectric constant, small thermal expansion coefficient, high heat resistance, high glass transition temperature and high mechanical properties, a precursor of the polyimide, and processes for producing them. A polyimide precursor whose molecular chain comprises repeating units represented by the following general formula (1) and repeating units represented by the following general formula (2):

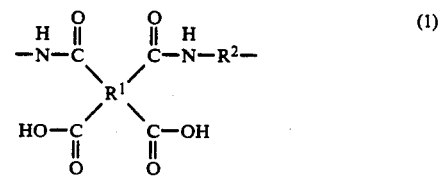

(1)

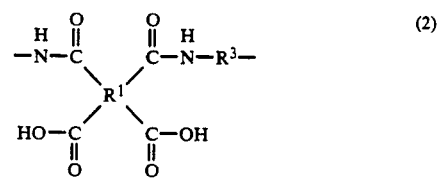

(2)

wherein $R^1$ is at least one kind of tetravalent organic group selected from the group consisting of

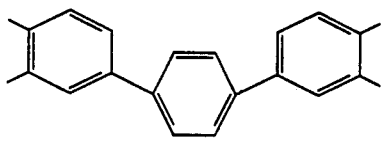

and

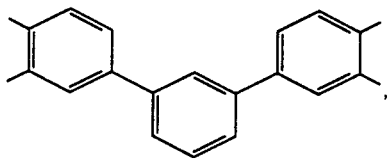

$R^2$ is at least one kind of divalent organic group having a linear structure which is selected from the group consisting of (Abstract continued on next page.)

-continued
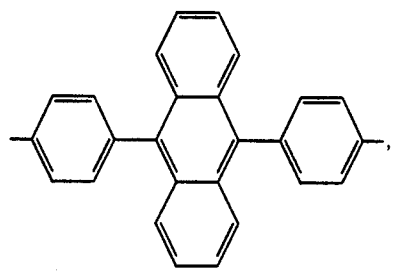
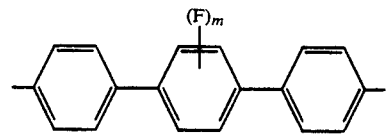
and
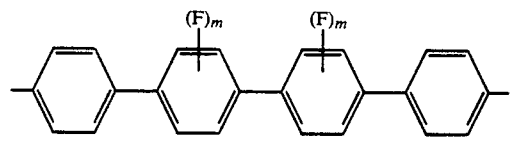
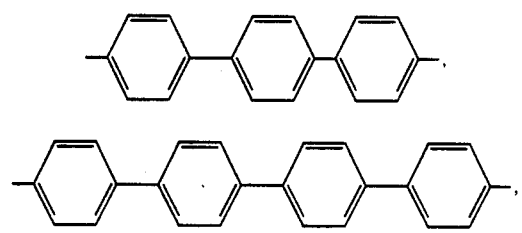
m is an integer of 1 to 4, and $R^3$ is a divalent organic group having a non-linear structure which contains at least two aromatic rings.
11 Claims, 5 Drawing Sheets

POLYIMIDE PRECURSOR, CURED PRODUCT THEREOF, AND PROCESSES FOR PRODUCING THEM

BACKGROUND OF THE INVENTION

1. Field of the Invention

The present invention relates to a polyimide precursor and a cured product thereof which have a small dielectric constant, a small thermal expansion coefficient and a high heat resistance, and processes for producing them.

2. Prior Art

Polyimides have heretofore been known as resins having a high heat resistance. In general, they are obtained, for example, by a process which comprises subjecting a diamine component and a tetracarboxylic acid dianhydride component to polymerization in an organic solvent to form a poly(amic acid), followed by dehydrating-ring closure of the poly(amic acid).

As examples of the polyimides, there are known (a) novel polyimides comprising structural units represented by the general formula (I) or the general formula (II):

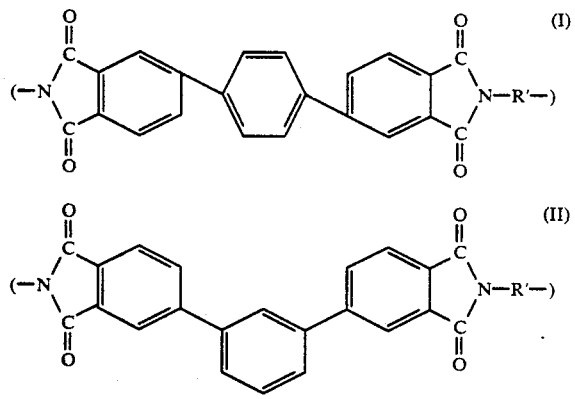

(wherein R' is a divalent hydrocarbon group), and poly(amic acid)s or poly(amic acid) esters which are precursors of the polyimides (Japanese Patent Application Kokai Nos. 62-265327 and 63-10629):

There are also known (b) polyimides comprising repeating units represented by the general formula (III):

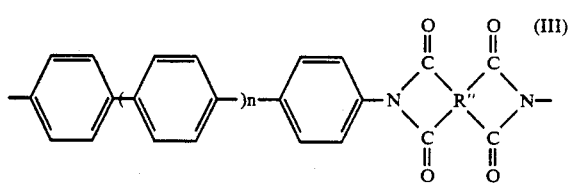

wherein R" is a tetravalent aliphatic or aromatic group, and n is 1 or 2 (Japanese Patent Application Kokai Nos. 57-114258, 57-188853, 60-250031 and 60-221426).

There are also known (c) polyimides comprising repeating units represented by the general formula (IV):

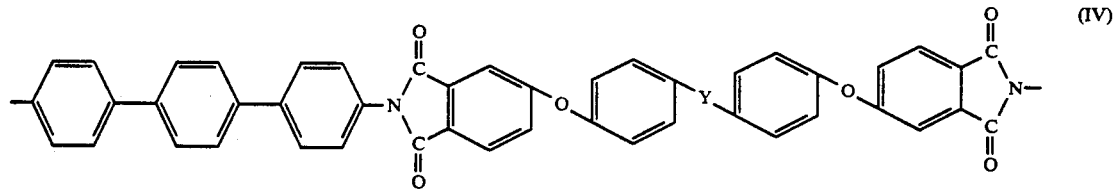

wherein Y is —C(CH$_3$)$_3$—, —C(CF$_3$)$_3$—or —SO$_2$—(-Japanese Patent Application Kokai Nos. 62-231935, 62-231936 and 62-231937).

There are also known (d) polyimides having a small dielectric constant which are obtained from 2,2-bis-(3,4-dicarboxyphenyl)propanoic dianhydride or 2,2-bis(3,4-dicarboxyphenyl)hexafluoropropanoic dianhydride and an aromatic diamine such as 4,4'-bis(4-aminophenoxy)-biphenyl of 4,4'-bis(4-amino-2-trifluoromethylphenoxy)biphenyl (Japanese Patent Application Kokai 2-60934).

There are also known (e) polyimides obtained from 2,2-bis(4-aminophenyl)hexafluoropropane, 2,2-bis-(3-aminophenyl)hexafluoropropane and a mixed acid dianhydride consisting of pyromellitic dianhydride and an acid dianhydride having a diaryl nucleus (Japanese Patent Application Kokai 2-67320), and polyimides obtained from 2,2-bis(3,4-dicarboxyphenyl)hexafluoropropanoic dianhydride, 2,2-bis(4-aminophenyl)hexafluoropropane and 2,2-bis(3-aminophenyl)hexafluoropropane (Japanese Patent Application Kokai 2-86624).

The above-mentioned polyimides (a), (b), (c), (d) and (e) do not satisfy all of the requirements such as high heat resistance, small dielectric constant, small thermal expansion coefficient, high mechanical properties (in particular, high flexibility) and high glass transition temperature. The polyamides (a), (b) and (c) are excellent with respect to high heat resistance, small thermal expansion coefficient and high glass transition temperature, but have a large dielectric constant and a low flexibility. It can be speculated that the reason for their advantages such as high heat resistance, high glass transition temperature and small thermal expansion coefficient and their defects such as large dielectric constant and low flexibility is that these polymers have a relatively large number of imide rings and comprise structural units represented by the formula

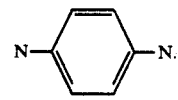

The polyamides (d) and (e) have a small dielectric constant and a high flexibility because they contain —CF$_3$ (trifluoromethyl groups) and —O—linkages. But, they have a low heat resistance, a low glass transition temperature and a large thermal expansion coefficient, and moreover it is conjectured that because of their —CF$_3$ groups, they have a low resistance to an alkali solution, for example, as electroless plating solution.

SUMMARY OF THE INVENTION

In order to find a polyimide having all of the characteristics unattainable by the prior art, i.e., high heat resistance, small dielectric constant, small thermal expansion coefficient, high mechanical properties (in particular, high flexibility), high glass transition temperature, high alkali resistance, etc., the present inventors earnestly investigated, and consequently accomplished the present invention.

The present invention relates to a polyimide precursor whose molecular chain comprises repeating units represented by the following general formula (I) and repeating units represented by the following general formula (2):

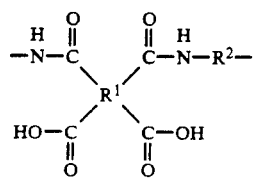
(1)

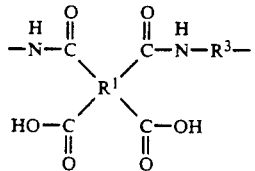
(2)

wherein $R^1$ is at least one kind of tetravalent organic group selected from the group consisting of

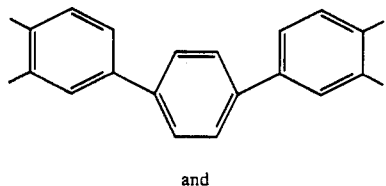

and

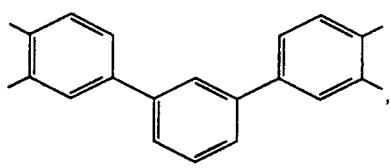

$R^2$ is at least one kind of divalent organic group having a linear structure which is selected from the group consisting of

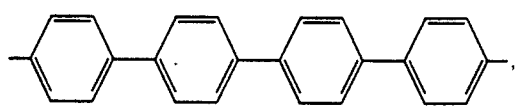

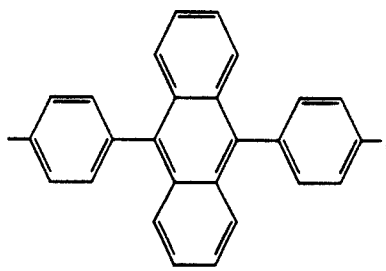

and

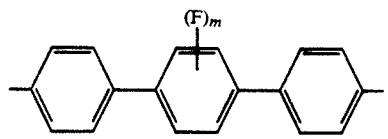

and

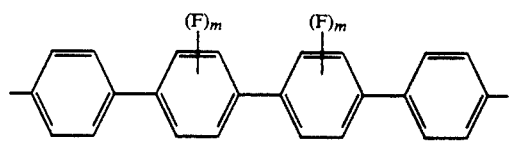

m is an integer of 1 to 4, and $R^3$ is a divalent organic group having a crooked or non-linear structure which contains at least two aromatic rings.

In the above polyimide precursor, when the sum of the number of the divalent organic groups of a linear structure represented by —$R^2$— in the general formula (1) and the number of the divalent organic groups of a crooked or non-linear structure represented by —$R^3$— in the general formula (2) is taken as 100, the number of the organic groups represented by —$R^2$— is preferably 30 to 80, and the number of the organic group represented by —$R^3$— is preferably 70 to 20. When the number of the organic groups represented by —$R^2$— is more than 80 and the number of the organic groups represented by —$R^3$— is less than 20, a polyimide film formed of the polyimide precursor is not sufficient in flexibility. When the number of the organic groups represented by —$R^2$— is less than 30 and the number of he organic groups represented by —$R^3$— is more than 70, the glass transition temperature Tg is low and the thermal expansion coefficient is large. When the polyimide precursor is used in a multi-layer wiring structure of the like which is required to have a smaller thermal expansion coefficient, the number of the organic groups represented by —$R^2$— is more preferably 80 to 50 and the number of the organic groups represented by —$R^3$— is more preferably 20 to 50.

The present invention relates also to a polyimide precursor whose molecular chain comprises repeating units represented by the following general formula (1), repeating units represented by the following general formula (2) and repeating units represented by the following general formula (3):

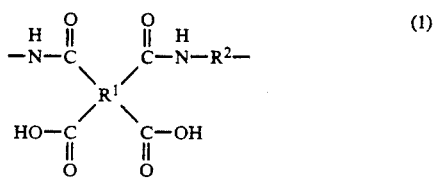
(1)

-continued

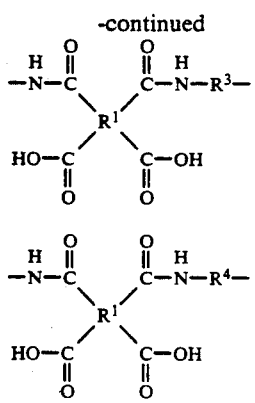
(2)

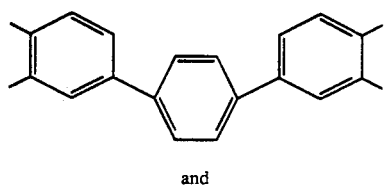
(3)

wherein R¹ is at least one kind of tetravalent organic group selected from the group consisting of

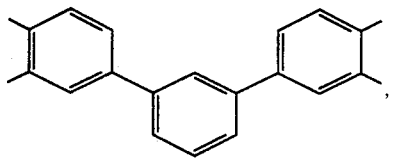

and

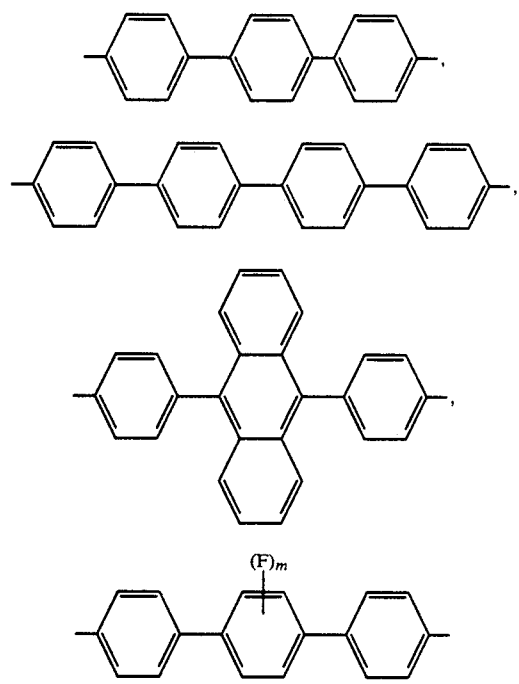

R² is at least one kind of divalent organic group having a linear structure which is selected from the group consisting of and -continued

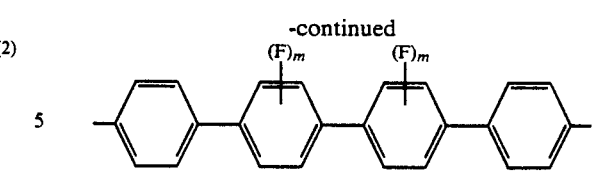
(2)

m is an integer of 1 to 4, $R^3$ is a divalent organic group having a crooked or non-linear structure which contains at least two aromatic rings, and $R^4$ is a hydrocarbon group containing one or more silicon atoms (hereinafter referred to as silicon-containing hydrocarbon group, too) which is represented by the following general formula (4) or the following general formula (5) when $R^4$ is at the end of in the main chain, respectively, of the polymer:

(4)

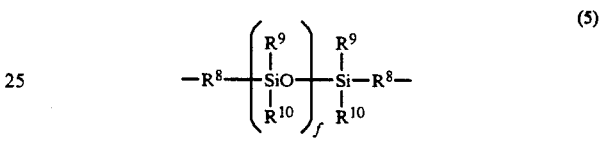
(5)

wherein each of $R^5$ and $R^8$ is a hydrocarbon group having 1 to 9 carbon atoms or a saturated alkyl group having 1 to 7 carbon atoms which contains an ether linkage; $R^6$ is a hydrocarbon group having 1 to 3 carbon atoms; $R^7$ is at least one kind of group selected from alkyl or trialkylsilyl groups, each alkyl having 1 to 5 carbon atoms, which contain an ether linkage of necessary; each of $R^9$ and $R^{10}$ is at least one kind of group selected from the group consisting of alkyl groups having 1 to 3 carbon atoms and aryl groups having 1 to 9 carbon atoms; n is an integer of 0 to 3; and f is a positive integer.

In the above polyimide precursor, when the sum of the number of the divalent organic groups of a linear structure represented by —$R^2$— in the general formula (1), the number of the divalent organic groups of a crooked structure represented by —$R^3$— in the general formula (2), and the number of the silicon-containing hydrocarbon groups represented by —$R^4$—is taken as 100, then number of the organic groups represented by —$R^2$—is preferably 30 to 80, the number of the organic groups represented by —$R^3$—is preferably 70 to 20, and the number of the silicon-containing hydrocarbon groups represented by —$R^4$—is preferably 0.1 to 10. Preferable ranges of the number of the organic groups represented by —$R^2$—and the organic groups represented by —$R^3$—are the same as in the polyimide precursor previously described. In addition, the introduction of the silicon-containing hydrocarbon groups represented by —$R^4$—is for improving the adhesive properties. When the proportion of the silicon-containing hydrocarbon groups is less than 0.1%, the introduction has no sufficient improving effect on the adhesive properties. When the proportion is more than 10%, the introduction has an undesirable influence on the heat resistance and the mechanical properties. The proportion is more preferably 0.5 to 5%.

The above polyimide precursors can be produced in the following manner.

There is employed a process for producing the polyimide precursor from a tetracarboxylic acid dianhydride and two or more diamine components. In detail, the polyimide precursor can be obtained by subjecting a tetracarboxylic acid dianhydride of the general formula (6):

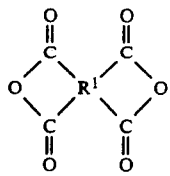
(6)

(wherein $R^1$ is at least one kind of tetravalent organic group selected from the group consisting of

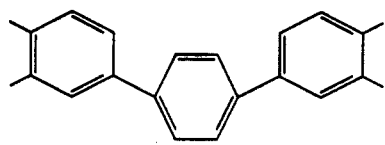

and

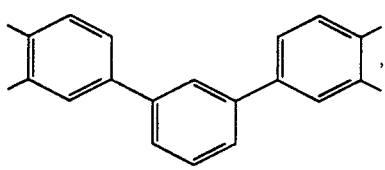

and diamine components to polymerization in a polar solvent, followed by heating with stirring at 50° to 80° C., wherein the diamine components comprise 1) 30 to 80 parts by mole of a diamine of the general formula $H_2N-R^2-NH_2$ (wherein $R_2$ is at least one kind of divalent organic group of a linear structure which is selected from the group consisting of

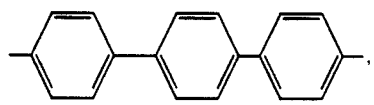

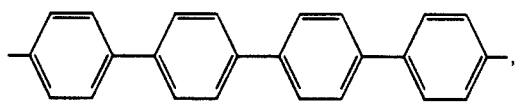

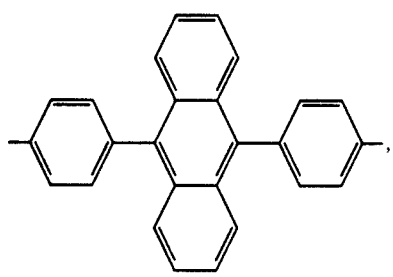

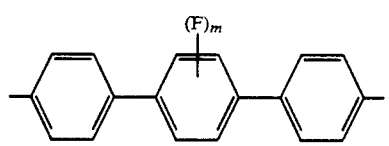

and

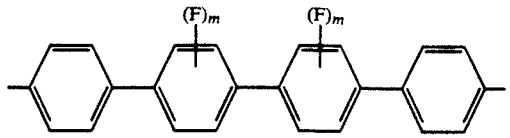

and m is an integer of 1 to 4), 2) 70 to 20 parts by mole of a diamine of the general formula $H_2N-R^3-NH_2$ (wherein $R^3$ is a divalent organic group of a crooked or non-linear structure which contains at least two or more aromatic rings), and optionally 3) 0.1 to 10 parts by mole of an aminosilane compound, in terms of diamine, or a siloxane diamine which are represented by the following general formula (7) or the following general formula (8), respectively:

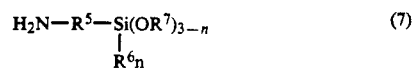
(7)

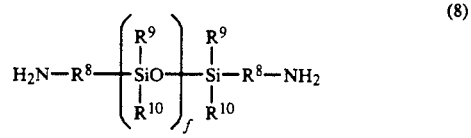
(8)

(wherein each of $R^5$ and $R^8$ is a hydrocarbon group having 1 to 9 carbon atoms or a saturated alkyl group having 1 to 7 carbon atoms which contains an ether linkage; $R^6$ is a hydrocarbon group having 1 to 3 carbon atoms; $R^7$ is at least one kind of group selected from alkyl or trialkylsilyl groups, each alkyl having 1 to 5 carbon atoms, which contain an ether linkage if necessary; each of $R^9$ and $R^{10}$ is at least one kind of group selected from the group consisting of alkyl groups having 1 to 3 carbon atoms and aryl groups having 1 to 9 carbon atoms; n is an integer of 0 to 3; and f is a positive integer), the total amount of the diamines used, including the aminosilane compound in terms of diamine, being taken as 100 parts by mole.

A polyimide cured product can be obtained by heat-curing the above polyimide precursor at 100° C. or higher.

As a result of experiments carried out by the present inventors, it was found that when the polyimide cured product obtained according to the present invention is formed as a polyimide cured film, the cured film has all of characteristics such as high heat resistance, small dielectric constant, small thermal expansion coefficient, high mechanical properties (in particular, high flexibility), high glass transition temperature, etc.

PREFERRED DESCRIPTION OF THE INVENTION

Figure 1:
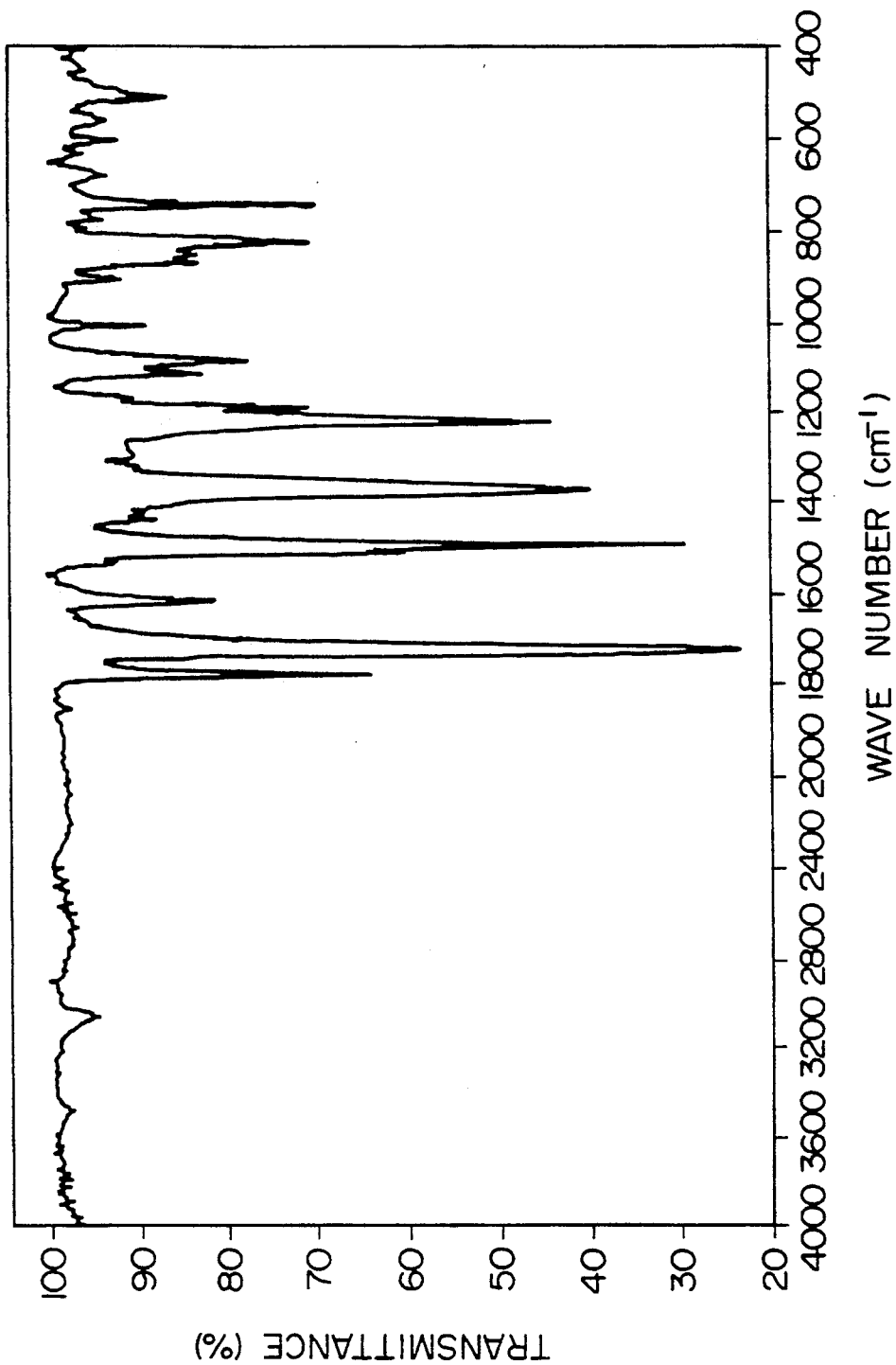
FIG. 1 is an infrared absorption spectrum of a polyimide film obtained in Example 1.

As the tetracarboxylic acid dianhydride used in the present invention, there can be used p-terphenyl-3,3'',4,4''-tetracarboxylic acid dianhydride and m-terphenyl-3,3'',4,4''-tetracarboxylic acid dianhydride.

The diamine of the general formula $N_2H-R^2-NH_2$ used in the present invention includes 4,4''-diamino-p-terphenyl, 4,4'''-diamino-p-quaterphenyl, 9,10-bis(4-diaminophenyl)anthracene, 4,4''-diamino-2'-fluoro-p-terphenyl, 4,4''-diamino-2,5'-difluoro -p-terphenyl, 4,4''-diamino-2',3'-difluoro-p-terphenyl, 4,4''-diamino-2',6'-difluoro-p-terphenyl, 4,4''-diamino-2',3',5'-trifluoro-p-terphenyl, 4,4''-diamino-2',3',5',6'-tetrafluoro-p-terphenyl, 4,4''-diamino-p-terphenyl, 4,4'''-diamino-2',3',5',6',2'',3'',5'',6''-octafluoro-p-quaterphenyl, 4,4'''-diamino-2',5',2'',5''-tetrafluoro-p-quaterphenyl, etc.

The divalent organic group $-R^3-$ of a crooked or non-linear structure in the general formula (2) and the general formula $N_2H-R^3-NH_2$ includes, for example,

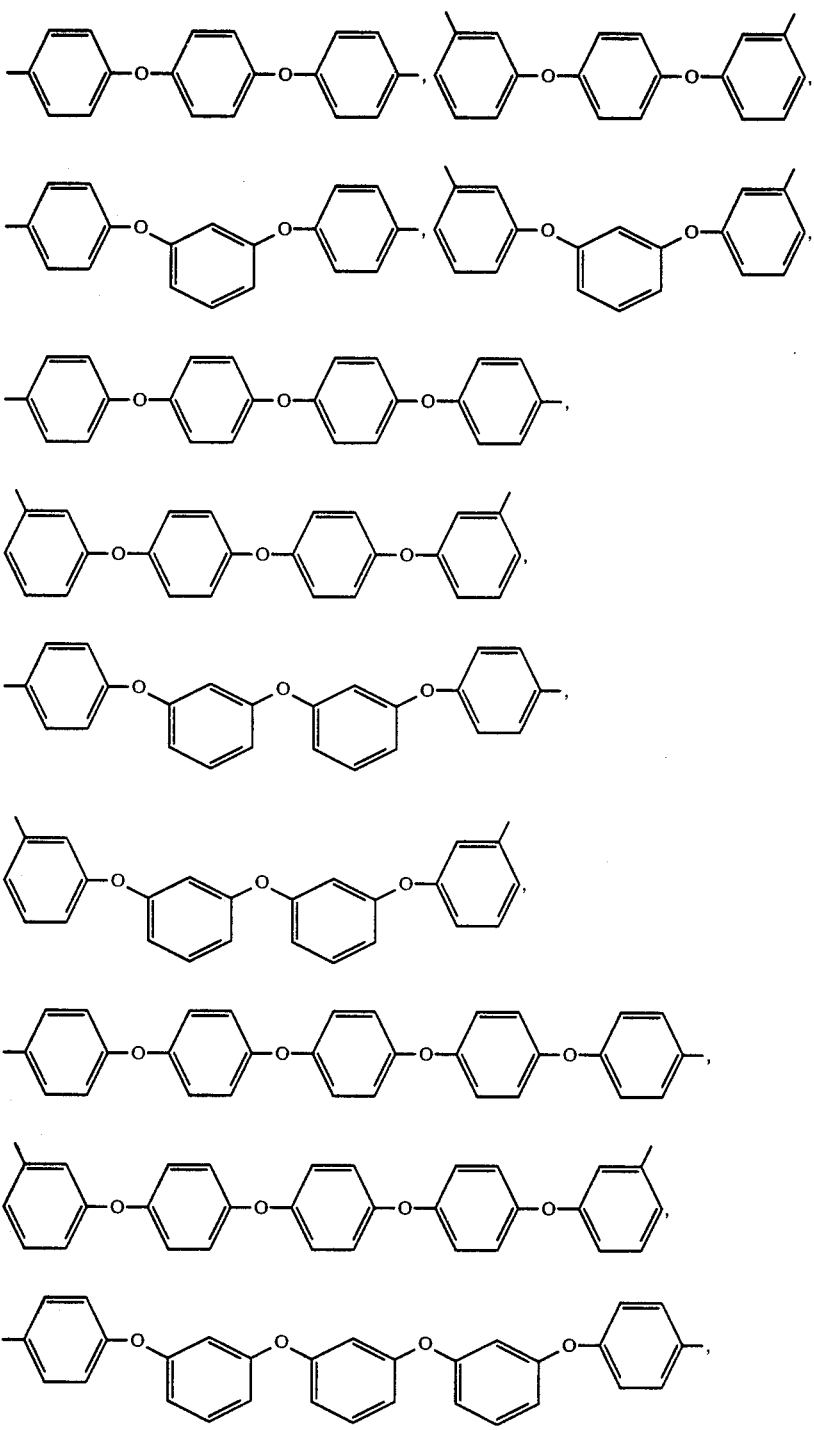

-continued
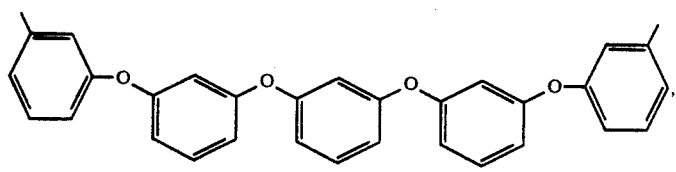
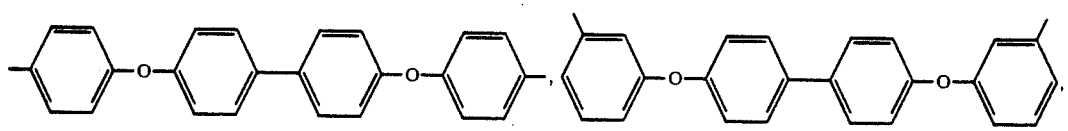
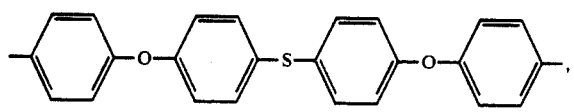
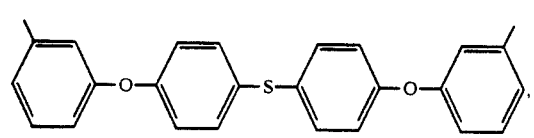
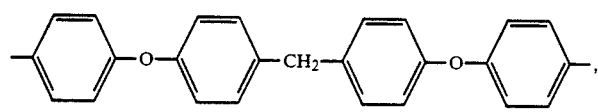
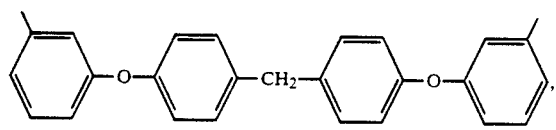
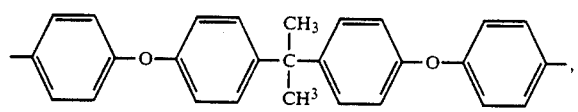
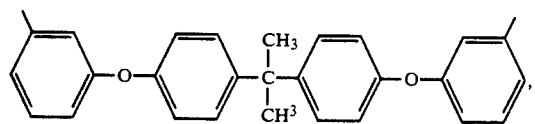
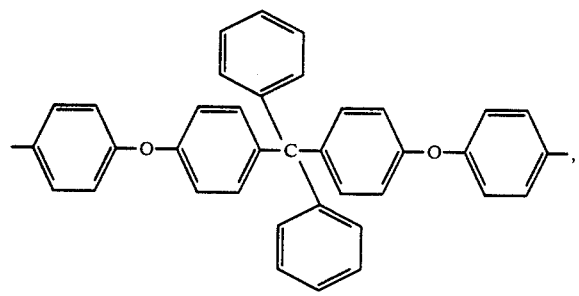

-continued
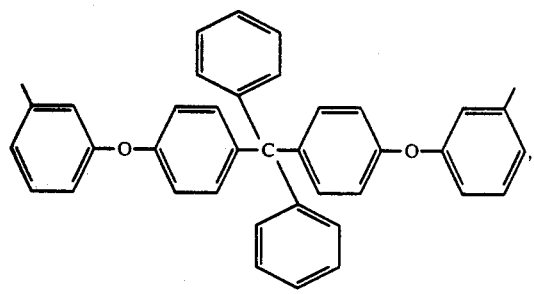
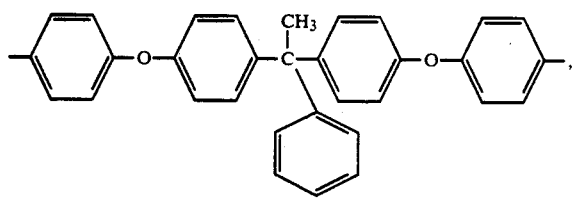
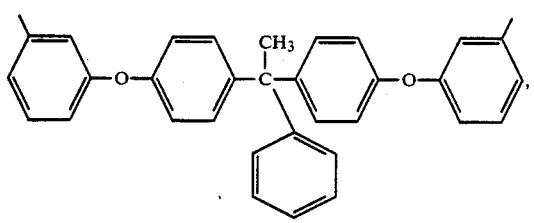
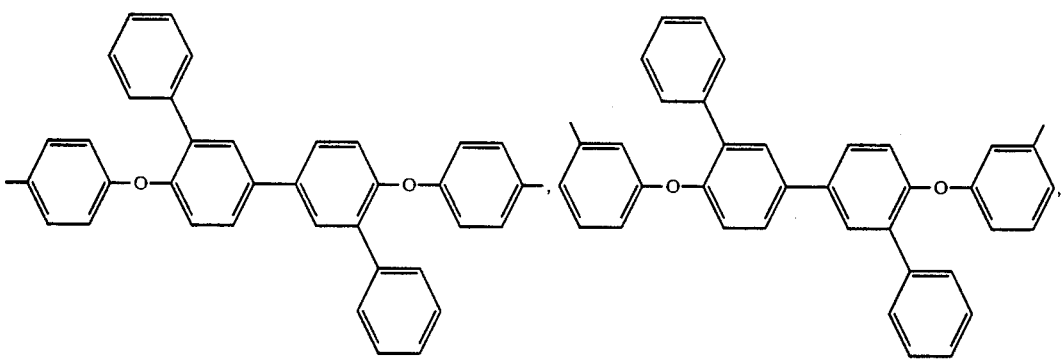
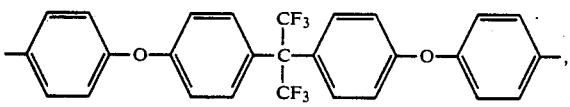
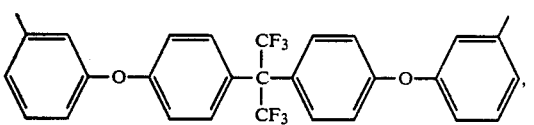
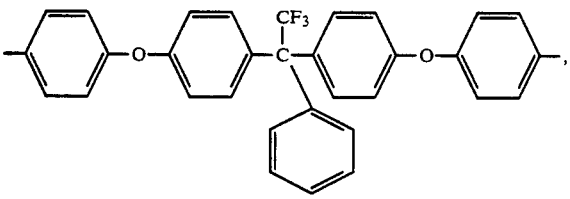

-continued
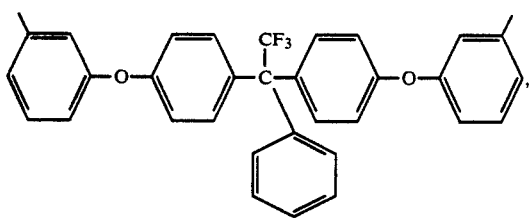
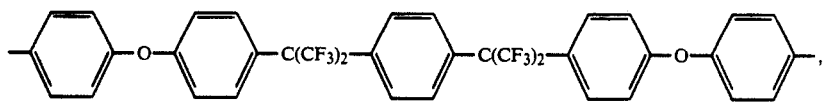
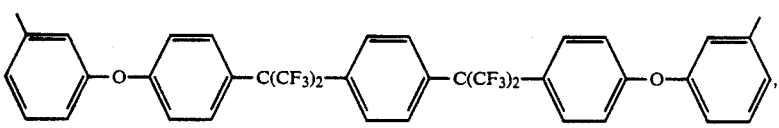
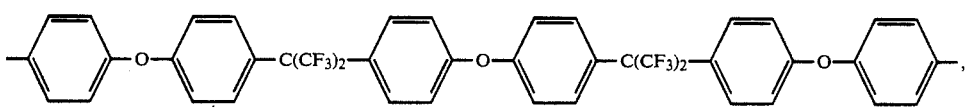
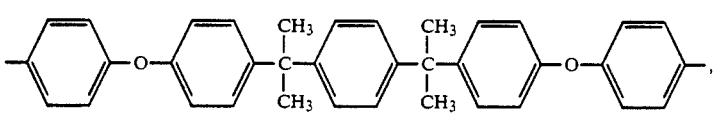
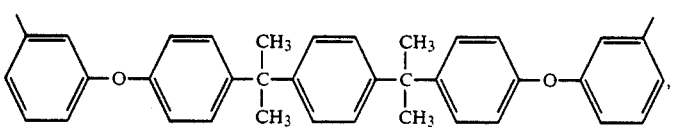
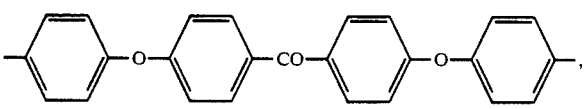
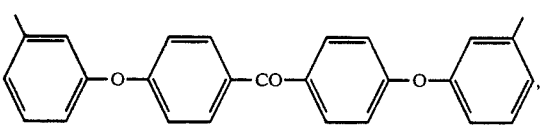
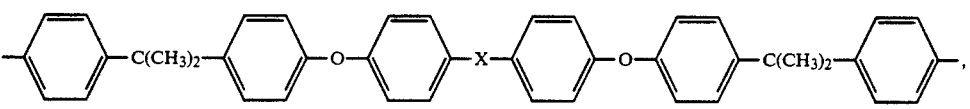
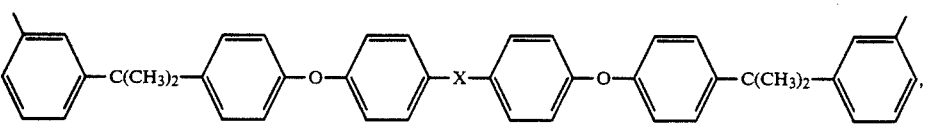
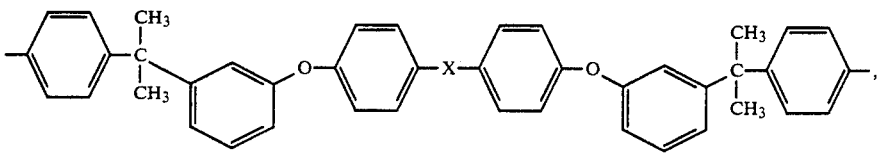

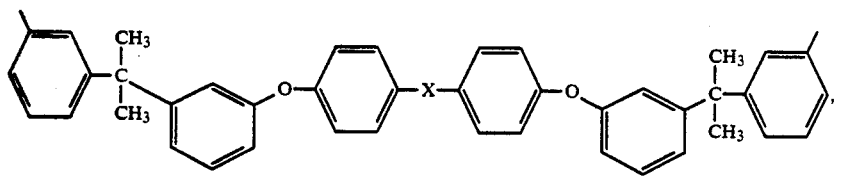

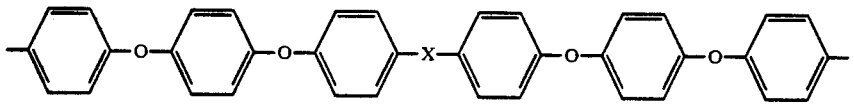

and

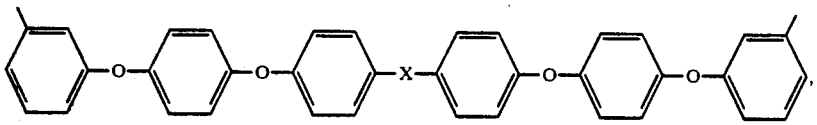

wherein X is —O—, —S—, —C(CH₃)₂—, —CH₂—, —C(CF₃)₂—, —C(C₆H₅)₂—, —C(C₆H₅)(CH₃)— or —CO—. These compounds can be used singly or in combination of two or more thereof.

Other diamines may be used for adjusting the heat resistance, dielectric constant, thermal expansion coefficient, glass transition temperature, mechanical strength or flexibility. As the other diamines, there can be mentioned diamines of the general formula $H_2N-R^{11}-NH_2$ in which $R^{11}$ is

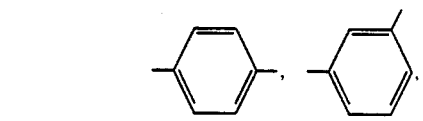

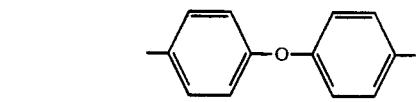

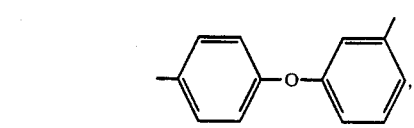

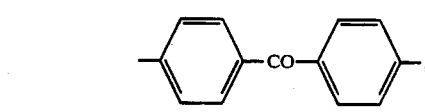

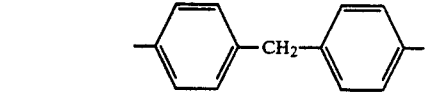

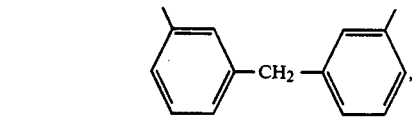

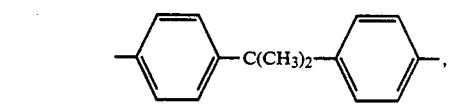

-continued

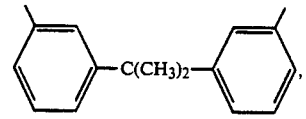

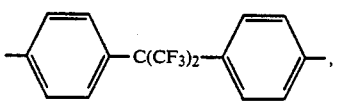

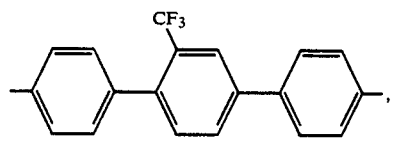

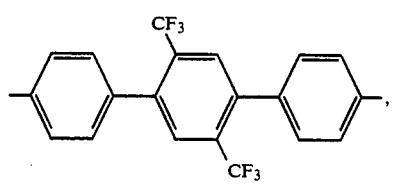

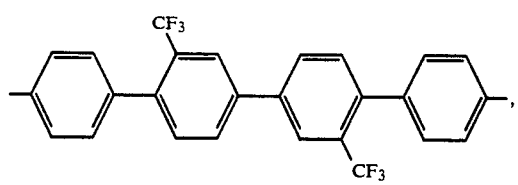

or the like.

As the aminosilane compound used in the present invention, there can be mentioned monoaminosilane compounds of the general formula (7):

$$H_2N-R^5-\underset{\underset{R^6_n}{|}}{Si}(OR^7)_{3-n} \qquad (7)$$

wherein $R^5$ is a hydrocarbon group having 1 to 9 carbon atoms, or a saturated alkyl group having 1 to 7 carbon atoms which contains an ether linkage; $R^6$ is a hydrocarbon group having 1 to 3 carbon atoms; $R^7$ is at least one kind of group selected from alkyl or trialkylsilyl groups, each alkyl having 1 to 5 carbon atoms, which contain an ether linkage if necessary; and n is an integer of 0 to 3. Specific examples of the aminosilane compound include 3-aminopropyldialkylalkoxysilanes, 3-aminopropylalkyldialkoxysilanes and 3-aminopropyltrialkoxysilanes (e.g. 3-aminopropyltrimethylsilane, 3-aminopropyldimethylmethoxysilane, 3-aminopropylmethyldimethoxysilane, 3-aminopropyltrimethoxysilane, 3-aminopropyldimethylethoxysilane, 3-aminopropylmethyldiethoxysilane, 3-aminopropyltriethoxysilane, 3-aminopropyldimethylpropoxysilane, 3-aminopropylmethyldipropoxysilane, 3-aminopropyltripropoxysilane, 3-aminopropyldimethylbutoxysilane, 3-aminopropylmethyldibutoxysilane and 3-aminopropyltributoxysilane); 3-(4-aminophenoxy)propyldialkylalkoxysilanes; 3-(4-aminophenoxy)propylalkyldialkoxysilanes; 3-(4-aminophenoxy)propyltrialkoxysilanes; 3-(3-aminophenoxy)-propyldialkylalkoxysilanes; 3-(3-aminophenoxy)-propylalkyldialkoxysilanes; 3-(3-aminophenoxy)propyltrialkoxysilanes; 4-aminoobutyldialkylalkoxysilanes, 4-aminobutylalkyldialkoxysilanes and 4-aminobutyltrialkoxysilanes (e.g. 4-aminobutyldimethylethoxysilane, 4-aminobutylmethyldiethoxysilanes and 4-aminobutyltriethoxysilane); 3-aminopropyltris(trimethylsiloxy)silane; m-aminophenyldialkylalkoxysilanes, m-aminophenylalkyldialkoxysilanes and m-aminophenyltrialkoxysilanes (e.g. m-aminophenyldimethylmethoxysilane, m-aminophenylmethyldimethoxysilane, m-aminophenyltrimethoxysilane, m-aminophenyldimethylethoxysilane, m-aminophenylmethyldiethoxysilane, m-aminophenyltriethoxysilane, m-aminophenyldimethylpropoxysilane, m-aminophenylmethyldipropoxysilane and m-aminophenyltripropoxysilane); p-aminophenyldialkylalkoxysilanes, p-aminophenylalkyldialkoxysilanes and p-aminophenyltrialkoxysilanes (e.g. p-aminophenyldimethylmethoxysilane, p-aminophenylmethyldimethoxysilane, p-aminophenyltrimethoxysilane, p-aminophenyldimethylethoxysilane, p-aminophenylmethyldiethoxysylane, p-aminophenyltriethoxysilane, p-aminophenyldimethylpropoxysilane, p-aminophenylmethyldipropoxysilane and p-aminophenyltripropoxysilane); m-aminobenzyldialkylalkoxysilanes, m-aminobenzylalkyldialkoxysilanes and m-aminobenzyltrialkoxysilanes (e.g. m-aminobenzyldimethylethoxysilane, m-aminobenzylmethyldiethoxysilane, m-aminobenzyltriethoxysilane, m-aminobenzyldimethylpropoxysilane, m-aminobenzylmethyldipropoxysilane, m-aminobenzyltripropoxysilane, m-aminobenzyldimethylpropoxysilane, m-aminobenzylmethyldipropoxysilane and m-aminobenzyltripropoxysilane); p-aminobenzyldialkylalkoxysilanes, p-aminobenzylalkyldialkoxysilanes and p-aminobenzyltrialkoxysilanes (e.g. p-aminobenzyldimethylpropoxysilane, p-aminobenzylmethyldipropoxysilane and p-aminobenzyltripropoxysilane); p-aminophenethyldialkylalkoxysilanes, p-aminophenethylalkyldialkoxysilanes and p-aminophenethyltrialkoxysilanes (e.g. p-aminophenethyldimethylmethoxysilane, p-aminophenethylmethyldimethoxysilane and p-aminophenethyltrimethoxysilane); and hydrogenated products of the above benzyl-group- or phenethyl-group-containing compounds of meta-form or para-form.

As the siloxane diamine used in the present invention, there can be mentioned diaminosiloxane compounds of the general formula (8):

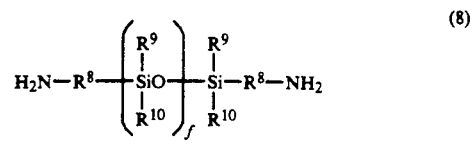

wherein $R^8$ is a hydrocarbon group having 1 to 9 carbon atoms, each of $R^9$ and $R^{10}$ is at least one kind of group selected from the group consisting of alkyl groups having 1 to 3 carbon atoms and aryl groups having 1 to 9 carbon atoms, and f is a positive integer. Specific examples of the siloxane diamine are as follows:

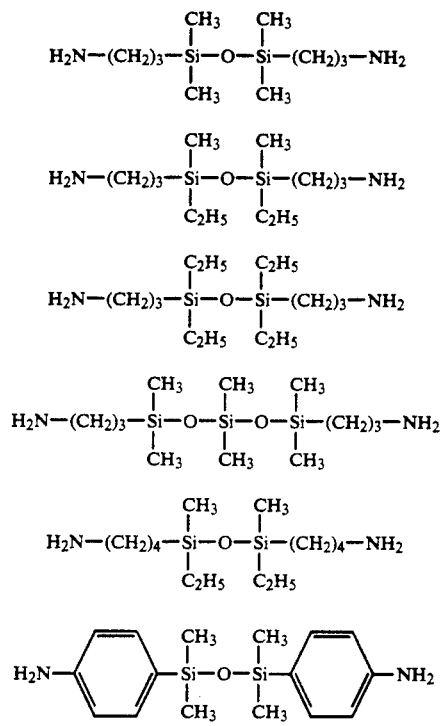

The above aminosilane compound or siloxane diamine is added for improving the adhesive properties, and the amount thereof used is 0.1 to 10%, preferably 0.5 to 5%, in terms of diamine, based on the total amount of diamine components when the amount of all amine components is taken as 100. When the amount is less than 0.1%, the addition has an insufficient improving effect on the adhesive properties. When the amount is more than 10%, the addition has an undesirable influence on the heat resistance and the mechanical properties.

The solvent used for producing the polyimide precursor and polyimide of the present invention includes, for example, N-methyl-2-pyrolidone, N,N-dimethylacetamide, N,N-dimethylformamide, dimethyl sulfoxide, hexamethylphosphoramide, tetramethylene sulfone, p-chlorophenol and p-bromophenol. These solvents can be used singly or in combination of two or more thereof.

The present invention is conducted as follows. In the case of the polyimide precursor, the diamines are first dissolved in the above-exemplified polar solvent, followed by adding thereto terphenyl-3,3'',4,4''-tetracarboxylic acid dianhydride, and the resulting solution is stirred for about 6 hours while maintaining the temperature at 0° to 30° C. Owing to the above procedure, the reaction proceeds gradually and the viscosity of the varnish is increased, whereby the polyimide precursor is produced. The viscosity of the varnish is adjusted by stirring the varnish while maintaining the temperature at 50° to 80° C.

The reduced viscosity of the polyimide precursor is preferably adjusted to 0.5 dl/g or more, for example, in the case where the solvent is N-methyl-2-pyrolidone, the concentration 0.1 g/100 ml, and the temperature 25° C.

When heat-cured at a temperature of 100° C. or higher, the above polyimide precursor obtained without the aminosilane compound or the siloxane diamine becomes a polyimide cured product whose molecular chain comprises repeating units of the following general formula (9) and repeating units of the following general formula (10). On such heat-curing, the polyimide precursor obtained by further using the aminosilane compound or the siloxane diamine becomes a polyimide cured product whose molecular chain comprises repeating units of the following general formula (9), repeating units of the following formula (10) and repeating units of the following formula (11).

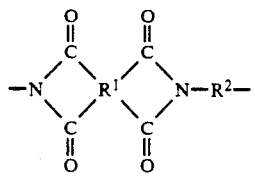
(9)

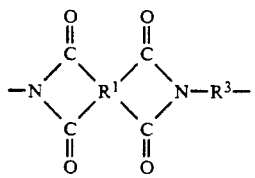
(10)

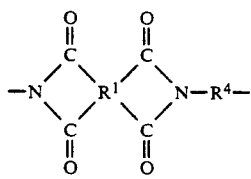
(11)

In the general formula (9), (10) and (11), $R^1$ is at least one kind of tetravalent organic group selected from the group consisting of

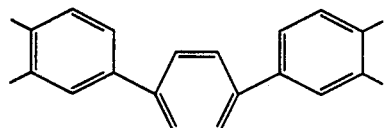

and

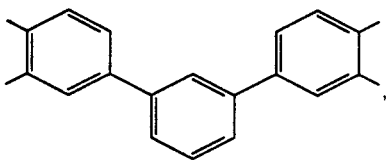

$R^2$ is at least one kind of divalent organic group of a linear structure which is selected from the group consisting of

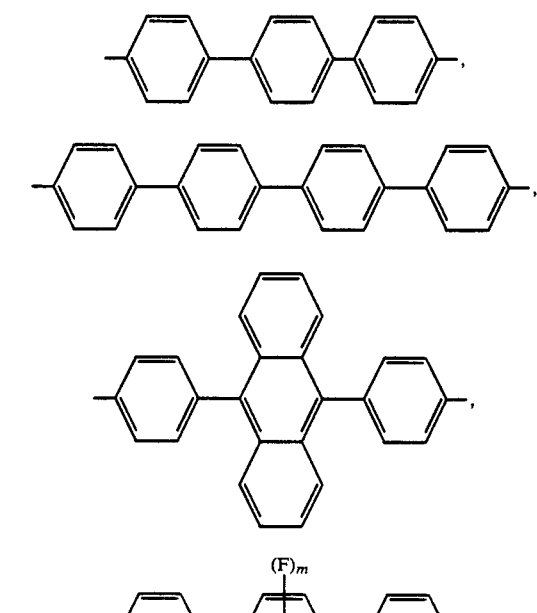

and

m is an integer of 1 to 4; $R^3$ is the same divalent organic group of a crooked structure, containing at least two aromatic rings as exemplified above for the above general formula (2); $R^4$ is a hydrocarbon group of the following general formula (4) or the following general formula (5) when $R^4$ is at the end or in the main chain, respectively, of the polymer:

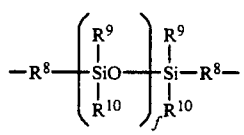
(4)

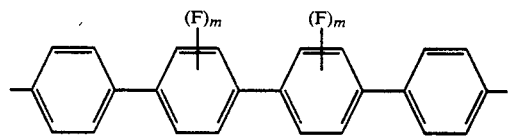
(5)

wherein each of $R^5$ and $R^8$ is a hydrocarbon group having 1 to 9 carbon atoms or a saturated alkyl group having 1 to 7 carbon atoms which contains an ether linkage; $R^6$ is a hydrocarbon group having 1 to 3 carbon atoms; $R^7$ is at least one kind of group selected from alkyl or trialkylsilyl groups, each alkyl having 1 to 5 carbon atoms, which contain an ether linkage if necessary; each of $R^9$ and $R^{10}$ is at least one kind of group selected from the group consisting of alkyl groups having 1 to 3 carbon atoms and aryl groups having 1 to 9 carbon atoms; n is an integer of 0 to 3; and f is a positive integer.

In the above polyimide cured products, the proportions of the number of the divalent organic groups of a linear structure represented by —$R^2$—in the general formula (9), the number of the divalent organic groups of a crooked structure represented by —$R^3$—in the general formula (10) and the number of the silicon-atom-containing hydrocarbon groups, represented by —$R^4$—correspond to the proportions in the respective polyimide precursors before the curing. That is, when the polyimide precursor is prepared by employing the desirable proportions described below, the proportions in the cured product are the same as in the precursor; when the sum of the number of the organic groups represented by —$R^2$—, the number of the organic groups represented by —$R^3$—and the number of the optionally introduced silicon-atom-containing hydrocarbon groups represented by —$R^4$—is taken as 100, the number of the organic groups represented by —$R^2$—is 30 to 80, the number of the organic groups represented by —$R^3$—70 to 20, and the number of the silicon-atom-containing hydrocarbon represented by —$R^4$—0.1 to 10.

As described above, according to the present invention, a polyimide and a precursor thereof which sufficiently have all of small dielectric constant. Small thermal expansion coefficient, high heat resistance, high glass transition temperature and high mechanical properties (high flexibility), could be obtained by using para- (or meta-)terphenyltetracarboxylic acid dianhydride and diamine components, i.e., a diamine the whole molecule of which is a rigid (linear) structure and a diamine having in the molecule a flexible (non-linear) structure. It can be speculated that since the polyimide of the present invention contains a large number of aromatic rings linearly bonded to each other and a relatively small number of imide rings responsible for the increase of the dielectric constant, the polyimide can have all of small dielectric constant, small thermal expansion coefficient, high heat resistance and high glass transition temperature. The introduction of fluoro groups into the diamine having a linear structure is effective in reducing the viscosity of the diamine, increases the solubility and tends to decrease the dielectric constant. Furthermore, high mechanical properties (high flexibility) could be imparted to the polyimide of the present invention by using the diamine having a flexible (non-linear) structure, as one of the diamine components.

The present inventive novel polyimide or poly(amic acid) as precursor of the polyimide is superior to conventional polyimides and polyimide precursors in all of characteristics such as are described above, and can be expected to have a high reliability. Therefore, the polyimide or poly(amic acid) of the present invention is useful for all industrial application purposes, for example, the production of a multi-layer wirings structure.

Next, the present invention is illustrated below with examples. The polyimide of the present invention is excellent in all of various characteristics. For comparing the comprehensive evaluation of the polyimide of the present invention with that of polyimides of comparative examples, characteristic values which are ideal when the polyimide is used, for example, as an insulating film in a multi-layer wiring structure, are described below as criteria for evaluating characteristic values.

Dielectric constant $\epsilon \leq 2.7$, thermal decomposition temperature $Td \geq 480°$ C., glass transition temperature $Tg \geq 350°$ C., thermal expansion coefficient $\alpha \leq 25$ ppm/° C., tensile strength $\geq 15$ kg/mm$^2$, Young's modulus $\leq 700$ kg/mm$^2$, elongation $\geq 10\%$, adhesive properties (peel strength, with Al chelate-treated silicon wafer) $\geq 200$ g/cm.

In each example, the characteristics of a film were evaluated by the following test methods.

(1) Dielectric constant $\epsilon$

Within 24 hours after the formation of the film, the dielectric constant was measured with a LCZ meter 4277A mfd. by YHP (YOKOKAWA Hewlett-Packard). Measurement conditions: humidity in a measuring chamber: 60% or less, frequency: 10 kHz, temperature: 25° C., electrode: Al-Al or Cr-Al.

(2) Thermal decomposition temperature Td

Using 50 mg of the film, the thermal decomposition temperature was measured in a nitrogen stream at a heating rate of 5° C./min by means of a high-speed differential calorimeter TGD-5000 mfd. by ULVAC. The temperature at which the weight loss was 3% was taken as the thermal decomposition temperature Td.

(3) Glass transition temperature Tg

The film was made into a 5 mm × 25 mm strip specimen and the elongation of the specimen was measured in a nitrogen stream by means of a thermo-mechanical analyzer TM-3000 mfd. by ULVAC. The temperature at which the elongation increased rapidly was taken as the glass transition temperature Tg.

(4) Thermal expansion coefficient $\alpha$

The film was made into a 5 mm × 25 mm strip specimen and the elongation of the specimen was measured in a nitrogen stream by means of a thermo-mechanical analyzer TM-3000 mfd. by ULVAC. The thermal expansion coefficient $\alpha$ was determined on the basis of the elongation.

(5) Tensile strength, Young's modulus, and elongation

The film was made into a 5 mm × 45 mm strip specimen (thickness: 8 μm), and the tensile strength and Young's modulus were determined on the basis of the elongation and the stress by means of an Instron tensile tester.

(6) Infrared absorption spectrum

A polyimide film of 1.2 to 1.8 μm in thickness was formed on a silicon wafer in the same manner as in Example 1 and then subjected to measurement as it was at room temperature by means of a Nicolet 170SX Fourier transform infrared spectrophotometer.

(7) Adhesive properties

The above-mentioned poly(amic acid) varnish was spin-coated on an Al chelate-treated silicon wafer and cured in a nitrogen stream at 200° C. for 30 minutes and then at 350° C. for 30 minutes to form a polyimide film (thickness: 8 μm). Subsequently, the silicon wafer having the polyimide film formed thereon was made into a 10 mm × 25 mm strip specimen, and the peel strength of the specimen was measured by an Instron tensile tester and taken as the adhesive properties.

(8) Reduced viscosity

The reduced viscosity of the poly(amic acid) was measured by dissolving powder of the poly(amic acid) in N-methyl-2-pyrolidone, and measuring the viscosity of the dilution at temperature of 25° C. and at a concentration of 0.1 g/100 ml by means of a Ubbelohde viscometer.

EXAMPLE 1

In 53.6 g of a 1:1 mixed solvent (solid concentration: 16%) of N,N-dimethylacetamide (DMAc) and N-methyl-2-pyrolidone (NMP) were dissolved 2.842 g (7.393 mmoles, 50% by mole based on the total number of moles of the diamine components) of bis[4-(4-aminophenoxy)phenyl] ether and 1.924 g (7.393 mmoles, 50% by mole based on the total number of moles of the diamine components) of 4,4''-diamino-p-terphenyl with stirring at room temperature in a nitrogen stream. Then, 5.475 g (14.78 mmoles) of p-terphenyl-3,3'',4,4''-tetracarboxylic acid dianhydride (TPDA) was dissolved in the resulting solution with stirring in a nitrogen stream. In this case, the temperature of the solution rose to about 30° C. and its viscosity became 150 poise. The solution thus obtained was heated at 60° to 70° C. for about 5 hours to adjust the viscosity to 56 poise, whereby a poly(amic acid) varnish was obtained. The varnish was diluted to adjust the concentration to 0.1 g/10 ml with N-methyl-2-pyrolidone. The viscosity of the dilution was measured at 25° C. with a Ubbelohde viscometer, and the reduced viscosity was determined to be 1.78 dl/g.

The poly(amid acid) varnish was spin-coated on each of a silicon wafer and a glass substrate, and cured in a nitrogen stream at 200° C. for 30 minutes and then at 350° C. for 30 minutes. The cured product was peeled from the substrate to obtain a film having a satisfactory flexibility.

Table 1 shows the composition of the polymer, and Table 2 the evaluation results. FIG. 1 shows an infrared absorption spectrum of the polyimide film. In FIG. 1, absorptions due to imide groups were observed at 1720 cm$^{-1}$ and 1780 cm$^{-1}$, whereby the production of the polyimide was confirmed.

EXAMPLES 2 to 9

Figure 2:
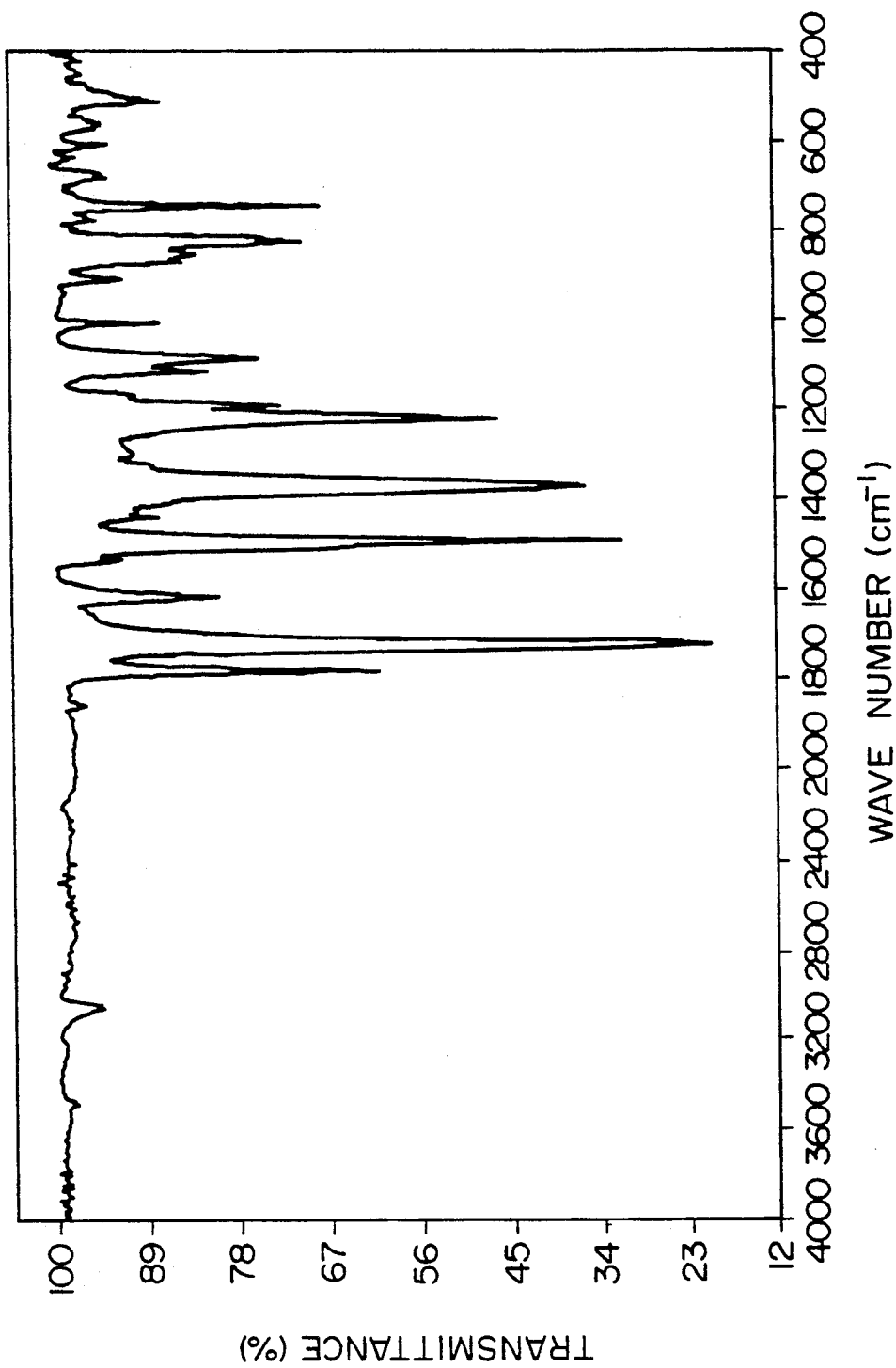
FIG. 2 is an infrared absorption spectrum of a polyimide film obtained in Example 2.
Figure 3:
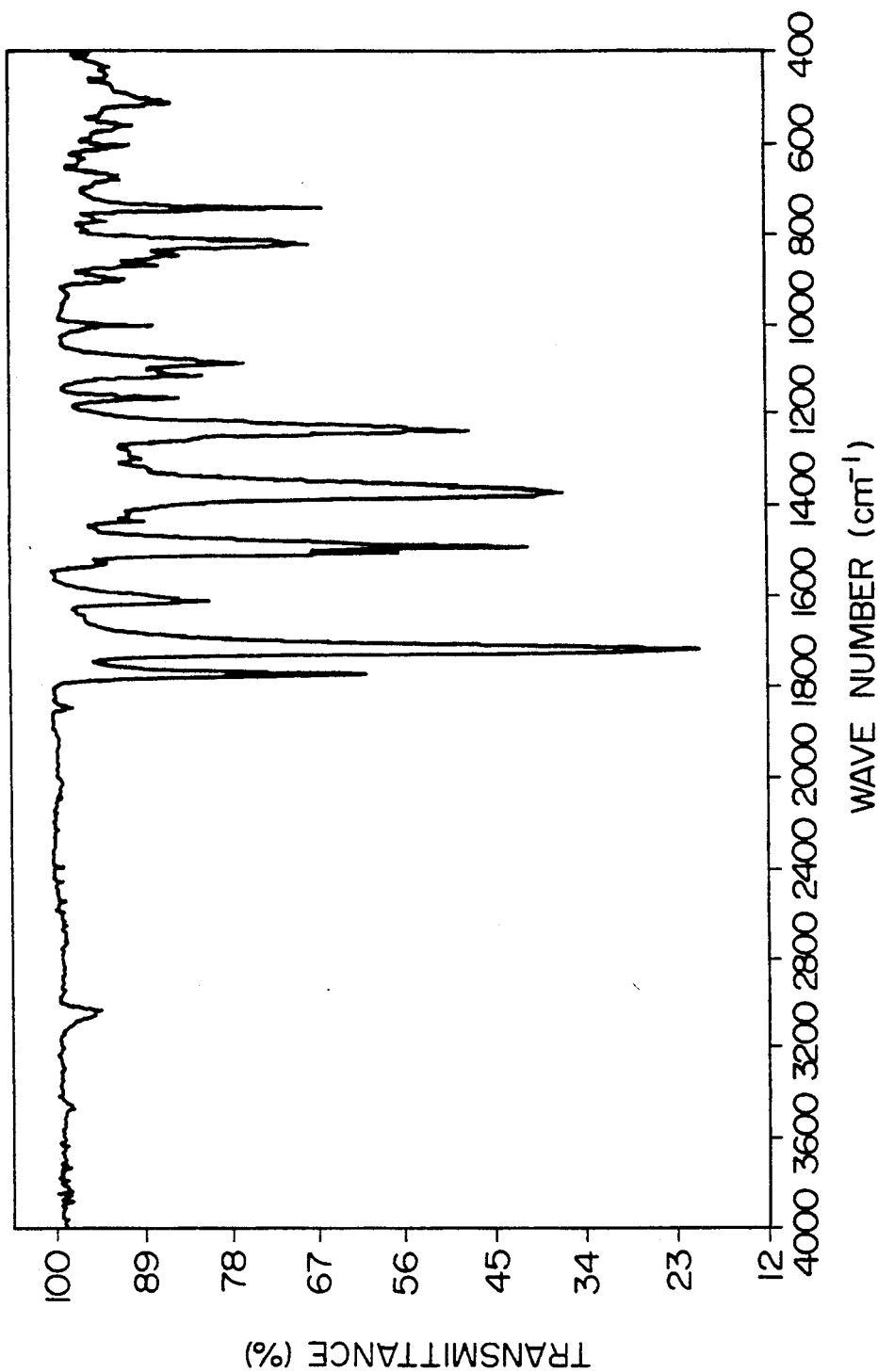
FIG. 3 is an infrared absorption spectrum of a polyimide film obtained in Example 5.

Polyimide films were formed in the same manner as in Example 1, except for using each combination of the components listed in Table 1. The characteristics of the films were evaluated in the same manner as in Example 1. The results obtained are shown in Table 2. The polyimide films obtained had a high flexibility and were satisfactory in all the characteristics. Infrared absorption spectra of the polyimide films of Example 2 and Example 5 are shown in FIG. 2 and FIG. 3, respectively. In FIG. 2 and FIG. 3, absorptions due to imide groups were observed at 1720 cm$^{-1}$ and 1780 cm$^{-1}$, whereby the production of the polyimide was confirmed.

EXAMPLE 10

In 36.2 g (solid concentration: 17%) of a 1:1 mixed solvent of N,N-dimethylacetamide (DMAc) and N-methyl-2-pyrolidone (NMP) were dissolved 1.661 g (4.321 mmoles, 40% by mole based on the total number of moles of the diamine components) of bis[4-(aminophenoxy)phenyl]-ether, 1.575 g (6.048 mmoles, 56% by mole based on the total number of moles of the diamine components) of 4,4''-diamino-p-terphenyl, and 0.165 g (0.864 mmole, 4% by mole (in terms of diamine) based on the total number of the diamine components) of 3-aminoproylmethyldimethoxysilane with stirring at room temperature in a nitrogen stream. Then, 4.0 g (10.80 mmoles) of p-terphenyl-3,3'',4,4''-tetracarboxylic acid dianhydride (TPDA) was dissolved in the resulting solution with stirring in a nitrogen stream. In this case, the temperature of the solution rose to about 30° C. and its viscosity became 88 poise. The solution thus obtained was heated at 60° to 70° C. for about 5 hours to adjust the viscosity to 38 poise, whereby a poly(amic acid) varnish was obtained.

Figure 4:
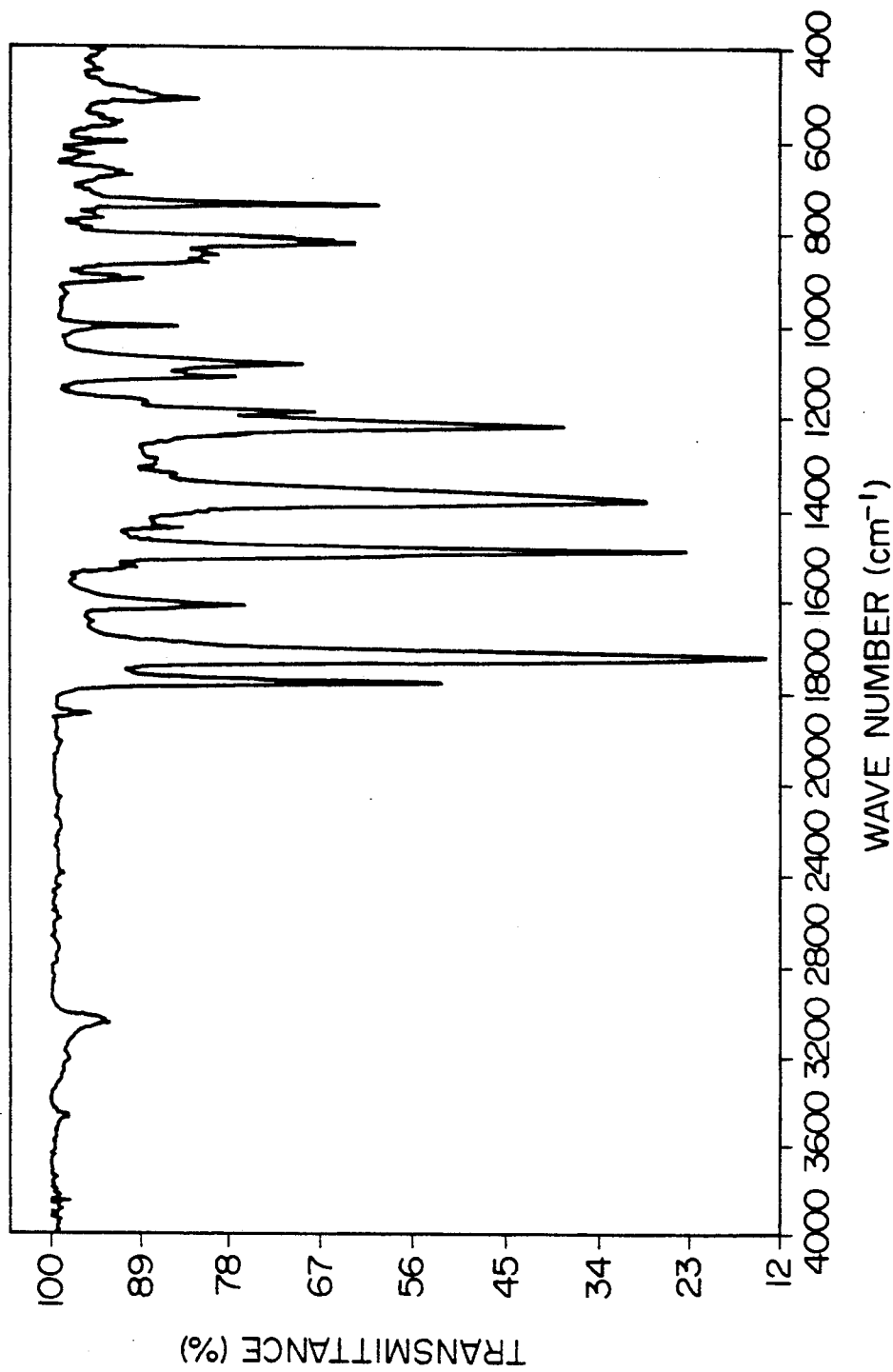
FIG. 4 is an infrared absorption spectrum of a polyimide film obtained in Example 10.

The poly(amic acid) varnish was spin-coated on a silicon wafer and cured in a nitrogen stream at 20° C. for 30 minutes and then at 350° C. for 30 minutes. Thereafter, the polyimide film thus formed was tried to be peeled from the wafer but was very difficult to peel, indicating that the film was very excellent in adhesive properties. In addition, a polyimide film was formed on a glass substrate in the same manner as in Example 1 and its characteristics values were evaluated in the same manner as in Example 1. The results obtained are shown in Table 2. An infrared absorption spectrum of the polyimide film is shown in FIG. 4. In FIG. 4, absorptions due to imide groups were observed at 1720 cm$^{-1}$ and 1780 cm$^{-1}$, whereby the production of the polyimide was confirmed.

EXAMPLE 11

A polyimide film was formed in the same manner as in Example 1, except for using m-terphenyl-3,3'',4,4''-tetracarboxylic acid dianhydride (m-TPDA) in place of p-terphenyl-3,3'',4,4''-tetracarboxylic acid dianhydride (TPDA). The characteristics of the film were evaluated. The results obtained are shown in Table 2. The polyimide film obtained were excellent in all the characteristics.

EXAMPLE 12

A polyimide film was formed in the same manner as in Example 1, except for using 9,10-bis(4-aminophenyl)anthracene in place of 4,4''-diamino-p-terphenyl. The characteristics of the film were evaluated. The results obtained are shown in Table 2. The polyimide film obtained were excellent in all the characteristics.

TABLE 1

Compositions of polymers Examples 1 to 10

| Example No. | Acid di- anhydride component | Diamine component | Solvent | Solid concentration (Final viscosity) (Reduced viscosity) |
|---|---|---|---|---|
| 1 | TPDA 5.475 g (14.78 mmoles) | 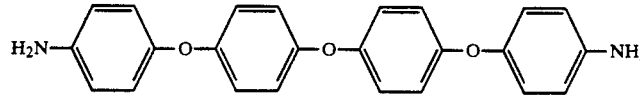  2.842 g (7.393 mmoles) 50% | Mixed solution of 26.8 g of NMP and 26.8 g of DMAc | 16.0% (56.0 P) (1.78 dl/g) |

TABLE 1-continued

Compositions of polymers Examples 1 to 10

| Example No. | Acid di-anhydride component | Diamine component | Solvent | Solid concentration (Final viscosity) (Reduced viscosity) |
|---|---|---|---|---|
| | | H₂N—⟨⟩—⟨⟩—⟨⟩—NH₂<br>1.924 g (7.393 mmoles) 50% | | |
| 2 | TPDA<br>4.083 g<br>(11.03 mmoles) | H₂N—⟨⟩—O—⟨⟩—O—⟨⟩—O—⟨⟩—NH₂<br>1.695 g (4.409 mmoles) 40%<br><br>H₂N—⟨⟩—⟨⟩—⟨⟩—NH₂<br>1.722 g (6.614 mmoles) 60% | Mixed solution of 19.7 g of NMP and 19.7 g of DMAc | 16.0%<br>(48.3 P)<br>(1.71 dl/g) |
| 3 | TPDA<br>5.678 g<br>(15.33 mmoles) | H₂N—⟨⟩—O—⟨⟩—O—⟨⟩—O—⟨⟩—NH₂<br>1.768 g (4.599 mmoles) 30%<br><br>H₂N—⟨⟩—⟨⟩—⟨⟩—NH₂<br>2.794 g (10.73 mmoles) 70% | Mixed solution of 25.0 g of NMP and 25.0 g of DMAc | 17.0%<br>(39.0 P)<br>(1.57 dl/g) |
| 4 | TPDA<br>5.539 g<br>(14.96 mmoles) | H₂N—⟨⟩—O—⟨⟩—⟨⟩—O—⟨⟩—NH₂<br>2.755 g (7.478 mmoles) 50%<br><br>H₂N—⟨⟩—⟨⟩—⟨⟩—NH₂<br>1.947 g (7.478 mmoles) 50% | Mixed solution of 31.5 g of NMP and 31.5 g of DMAc | 14.0%<br>(43.3 P)<br>(1.78 dl/g) |
| 5 | TPDA<br>4.121 g<br>(11.13 mmoles) | H₂N—⟨⟩—O—⟨⟩—⟨⟩—O—⟨⟩—NH₂<br>1.640 g (4.451 mmoles) 40%<br><br>H₂N—⟨⟩—⟨⟩—⟨⟩—NH₂<br>1.738 g (6.676 mmoles) 60% | Mixed solution of 19.7 g of NMP and 19.7 g of DMAc | 16.0%<br>(42.3 P)<br>(1.68 dl/g) |
| 6 | TPDA<br>4.188 g<br>(11.31 mmoles) | H₂N—⟨⟩—O—⟨⟩—⟨⟩—O—⟨⟩—NH₂<br>1.250 g (3.393 mmoles) 30% | Mixed solution of 18.3 g of NMP and 18.3 g of DMAc | 17.0%<br>(48.7 P)<br>(1.64 dl/g) |

TABLE 1-continued
Compositions of polymers Examples 1 to 10

| Example No. | Acid di-anhydride component | Diamine component | Solvent | Solid concentration (Final viscosity) (Reduced viscosity) |
|---|---|---|---|---|
| | | 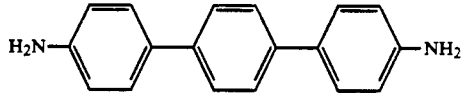<br>2.061 g (7.917 mmoles) 70% | | |
| 7 | TPDA<br>4.121 g<br>(11.13 mmoles) | 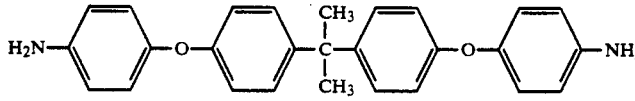<br>2.285 g (5.565 mmoles) 50%<br>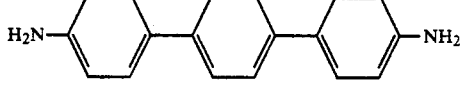<br>1.449 g (5.565 mmoles) 50% | Mixed solution of 22.3 g of NMP and 22.3 g of DMAc | 15.0%<br>(46.3 P)<br>(1.70 dl/g) |
| 8 | TPDA<br>4.121 g<br>(11.13 mmoles) | 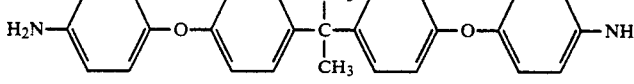<br>1.828 g (4.452 mmoles) 40%<br>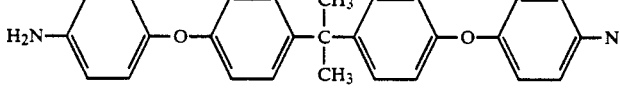<br>1.739 g (6.678 mmoles) 60% | Mixed solution of 21.8 g of NMP and 21.8 g of DMAc | 15.0%<br>(52.3 P)<br>(1.79 dl/g) |
| 9 | TPDA<br>4.121 g<br>(11.13 mmoles) | 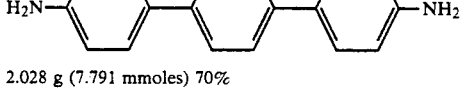<br>1.371 g (3.339 mmoles) 30%<br>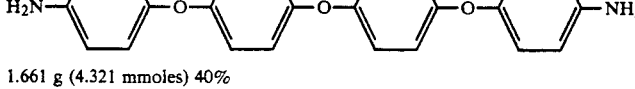<br>2.028 g (7.791 mmoles) 70% | Mixed solution of 21.5 g of NMP and 21.5 g of DMAc | 15.0%<br>(48.7 P)<br>(1.73 dl/g) |
| 10 | TPDA<br>4.000 g<br>(10.80 mmoles) | 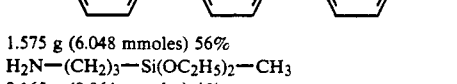<br>1.661 g (4.321 mmoles) 40%<br>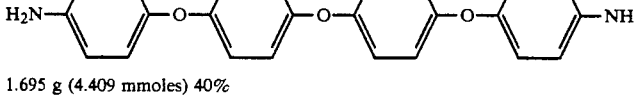<br>1.575 g (6.048 mmoles) 56%<br>$H_2N-(CH_2)_3-Si(OC_2H_5)_2-CH_3$<br>0.165 g (0.864 mmoles) 4% | Mixed solution of 18.1 g of NMP and 18.1 g of DMAc | 17.0%<br>(38.0 P)<br>(1.50 dl/g) |
| 11 | m-TPDA<br>4.083 g<br>(11.03 mmoles) | <br>1.695 g (4.409 mmoles) 40% | Mixed solution of 19.7 g of NMP and 19.7 g of DMAc | 16.0%<br>(48.8 P)<br>(1.73 dl/g) |

TABLE 1-continued

Compositions of polymers Examples 1 to 10

| Example No. | Acid dianhydride component | Diamine component | Solvent | Solid concentration (Final viscosity) (Reduced viscosity) |
|---|---|---|---|---|
| 12 | m-TPDA 4.083 g (11.03 g mmoles) | H₂N—⌬—⌬—⌬—NH₂  1.722 g (6.614 mmoles) 60%  <br> H₂N—⌬—O—⌬—O—⌬—O—⌬—NH₂  1.695 g (4.409 mmoles) 40%  <br> H₂N—⌬—(anthracene)—⌬—NH₂  1.722 g (6.614 mmoles) 60% | Mixed solution of 19.7 g of NMP and 19.7 g of DMAc | 16.9% (49.1 P) (1.78 dl/g) |

TABLE 2

Characteristics of polyimide films Examples 1 to 10

| Example No. | $\epsilon$ (10 kHz 25° C.) | Td (°C.) | Tg (°C.) | $\alpha$ (ppm/°C.) | Tensile strength (kg/mm²) | Young's modulus (kg/mm²) | Elongagation (%) |
|---|---|---|---|---|---|---|---|
| 1  | 2.7 | 550 | 390 | 21 | 16 | 420 | 17 |
| 2  | 2.7 | 550 | 400 | 18 | 18 | 540 | 15 |
| 3  | 2.7 | 550 | 410 | 15 | 20 | 660 | 10 |
| 4  | 2.7 | 560 | 370 | 23 | 22 | 460 | 17 |
| 5  | 2.7 | 560 | 400 | 18 | 23 | 560 | 15 |
| 6  | 2.7 | 550 | 400 | 14 | 24 | 690 | 11 |
| 7  | 2.7 | 530 | 360 | 25 | 15 | 380 | 18 |
| 8  | 2.7 | 540 | 390 | 19 | 19 | 500 | 15 |
| 9  | 2.7 | 540 | 390 | 16 | 23 | 630 | 11 |
| 10 | 2.7 | 540 | 400 | 18 | 18 | 540 | 14 |
| 11 | 2.7 | 550 | 390 | 19 | 19 | 510 | 16 |
| 12 | 2.7 | 560 | 390 | 18 | 20 | 530 | 13 |

COMPARATIVE EXAMPLES 1 to 4

Polyimide films were formed in the same manner as in Example 1, except for using each combination of the components listed in Table 3. The characteristics of the films were evaluated in the same manner as in Example 1. The results obtained are shown in Table 4. The polyimide films obtained were satisfactory films having a high flexibility, but they had a large thermal expansion coefficient and a low glass transition temperature and hence are considered to be poor in reliability when used in a multi-layer wiring structure or the like.

COMPARATIVE EXAMPLE 5

A polymer film was formed in the same manner as in Example 1, except for using the components listed in Table 3. The characteristics of the film were evaluated in the same manner as in Table 1. The results obtained are shown in Table 4. The polyimide film obtained had such a low flexibility that it could not be peeled in film form. Therefore, its characteristics such as thermal expansion coefficient, tensile strength and elongation could not be measured.

COMPARATIVE EXAMPLE 6

A polyimide film was formed in the same manner as in Example 1, except for using the composition of polymer listed in Table 3, namely, using biphenyl-3,3',4,4'-tetracarboxylic acid dianhydride (BPDA) as acid dianhydride and 4,4'-diaminodiphenyl ether as diamine. The dielectric constant and glass transition temperature of the film were measured. Consequently, the dielectric constant was as large as 3.0, and the glass transition temperature was as low as 290° C.

COMPARATIVE EXAMPLE 7

As another comparative example, PIQ (trade name mfd. by Hitachi Kasei Co., Ltd.) was used. The characteristic values of PIQ were evaluated in the same manner as in Example 1 and are shown in Table 4. Of the characteristic values of PIQ, values other than those of the Young's and the elongation did not fulfil the above criteria for evaluating the characteristic values.

EXAMPLE 13

In 57.9 g (solid concentration: 18%) of a 1:1 mixed solvent of N,N-dimethylacetamide (DMAc) and N-methyl-2-pyrolidone (NMP) were dissolved 2.842 g (7.393 mmoles, 50% by mole based on the total number of moles of the diamine components) of bis[4-(4-aminophenoxy)phenyl]ether and 2.1907 g (7.393 mmoles, 50% by mole based on the total number of moles of the di-

TABLE 3

Compositions of polymers Comparative Examples 1 to 5

| Comparative Example No. | Acid di-anhydride component | Diamine components | Solvent | Solid concentration (Final viscosity) |
|---|---|---|---|---|
| 1 | TPDA 5.025 g (13.57 mmoles) | 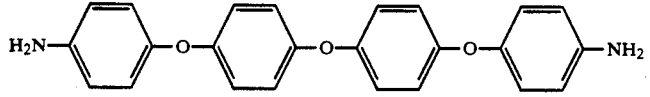 5.216 g (13.57 mmoles) | Mixed solution of 29.0 g of NMP and 29.0 g of DMAc | 15.0% (41.7 P) |
| 2 | TPDA 5.134 g (13.86 mmoles) | 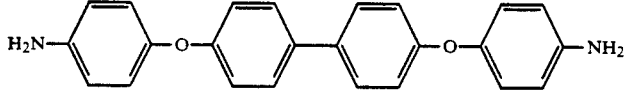 5.107 g (13.86 mmoles) | Mixed solution of 29.0 g of NMP and 29.0 g of DMAc | 15.0% (40.4 P) |
| 3 | TPDA 5.025 g (13.57 mmoles) | 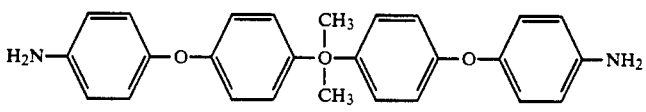 5.571 g (13.57 mmoles) | Mixed solution of 29.0 g of NMP and 29.0 g of DMAc | 15.4% (41.7 P) |
| 4 | TPDA 5.025 g (13.57 mmoles) | 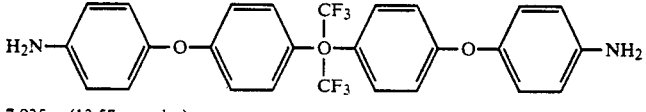 7.035 g (13.57 mmoles) | Mixed solution of 30.0 g of NMP and 30.0 g of DMAc | 16.7% (48.7 P) |
| 5 | TPDA 7.340 g (19.82 mmoles) | 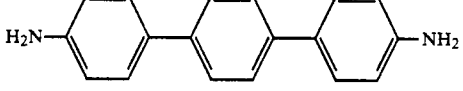 5.160 g (19.82 mmoles) | Mixed solution of 30.5 g of NMP and 30.5 g of DMAc | 17.0% (49.9 P) |
| 6 | TPDA 8.000 g (27.19 mmoles) | 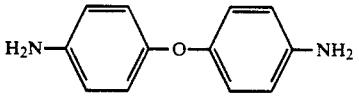 5.445 g (27.19 mmoles) | Mixed solution of 35.0 g of NMP and 35.0 g of DMAc | 16.1% (87.5 P) | amine components) of 4,4''-diamino-2',5'-difluoro-p-terphenyl (hereinafter abbreviated as DAFTP) with stir-

TABLE 4

Characteristics of polyimide films Comparative Examples 1 to 6

| Comparative Example No. | $\epsilon$ (10 kHz 25° C.) | Td (°C.) | Tg (°C.) | $\alpha$ (ppm/°C.) | Tensile strength (kg/mm$^2$) | Young's modulus (kg/mm$^2$) | Elongagation (%) |
|---|---|---|---|---|---|---|---|
| 1 | 2.7 | 490 | 325 | 48 | 12 | 390 | 52 |
| 2 | 2.7 | 490 | 335 | 42 | 13 | 410 | 48 |
| 3 | 2.7 | 480 | 320 | 52 | 11 | 340 | 55 |
| 4 | 2.6 | 470 | 270 | 68 | 10 | 310 | 50 |
| 5 | 2.7 | 540 | — | — | — | — | — |
| 6 | 3.0 | — | 290 | — | — | — | — |
| 7 | 3.5 | 460 | 310 | 40 | 14 | 330 | 20 | ring at room temperature in a nitrogen stream. Then, 5.4734 g (14.78 mmoles) of 3,3'',4,4''-p-terphenyl-tetracarboxylic acid dianhydride (TPDA) was dissolved in the resulting solution in a nitrogen stream. In this case, the temperature of the solution rose to about 40° C. and its viscosity became 130 poise. The solution thus obtained was heated at 60° C. to 70° C. for about 5 hours to adjust the viscosity to 54 poise, whereby a poly(amic acid) varnish was obtained.

The poly(amic acid) varnish was spin-coated on each of a silicon wafer and a glass substrate, and cured in a nitrogen stream at 200° C. for 30 minutes and then at 350° C. for 30 minutes. The cured product was peeled from the substrate to obtain a film having a satisfactory flexibility. Table 6 shows the results of evaluating the film.

EXAMPLE 14

In 50.6 g (solid concentration: 16%) of a 1:1 mixed solvent of N,N-dimethylacetamide (DMAc) and N-methyl-2-pyrolidone (NMP) were dissolved 1.6949 g (4.409 mmoles, 40% by mole based on the total number of moles of the diamine components) of bis[4-(4-aminophenoxy)phenyl] ether and 1.9599 g (6.614 mmoles, 60% by mole based on the total number of moles of the diamine components) of 4,4''-diamino-2',6'-difluoro-p-terphenyl (DAFTP) with stirring at room temperature in a nitrogen stream. Then, 4.0846 g (11.03 mmoles) of 3,3'',4,4''-p-terphenyltetracarboxylic acid dianhydride (TPDA) was dissolved in the resulting solution in a nitrogen stream. In this case, the temperature of the solution rose to about 40° C. and its viscosity became 145 poise. The solution thus obtained was heated at 60° to 70° C. for about 5 hours to adjust the viscosity to 45.7 poise, whereby a poly(amic acid) varnish was obtained.

The poly(amic acid) varnish was spin-coated on each of a silicon wafer and a glass substrate and cured in a nitrogen stream at 200° C. for 30 minutes and then at 350° C. for 30 minutes. The cured product was peeled from the substrate to obtain a film having a satisfactory flexibility. Table 6 shows the results of evaluating the characteristics of the film.

EXAMPLES 15 to 21

Polyimide precursors and cured films thereof were prepared in the same manner as in Example 13, except for using each combination of the components listed in Table 5. The characteristics of the films were evaluated in the same manner as in Example 13. The results obtained are shown in Table 6. The polyimide films obtained had a high flexibility and were satisfactory in all the characteristics. Table 6 shows the results of evaluating the characteristics of the films.

EXAMPLE 22

A polyimide precursor and a polyimide cured film were prepared in the same manner as in Example 13, except for using the components listed in Table 5. The characteristics of the film were evaluated in the same manner as in Example 13. The results obtained are shown in Table 6. The polyimide film obtained was a satisfactory film having a high flexibility. In the formation of the polyimide film by the use of the three monomer components listed in Table 5, when the proportion of DAFTP relative to the sum of the diamine components was less than 50%, the thermal expansion coefficient was increased $\geq 27$ ppm/° C.), the glass transition temperature was lowered 330° C.), and the thermal decomposition temperature was also lowered $\leq 490°$ C.). Therefore, in this case, it was necessary to adjust the proportion of DAFTP to 50% or more.

TABLE 5

Compositions of polymers Examples 13 to 22

| Example No. | Acid dianhydride component | Diamine component | Solvent | Solid concentration (Final viscosity) |
|---|---|---|---|---|
| 13 | TPDA 5.4734 g (14.78 mmoles) | 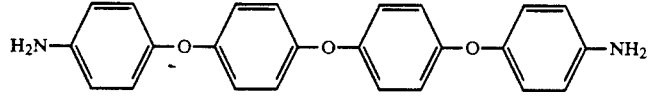<br>2.8421 g (7.393 mmoles) 50%<br>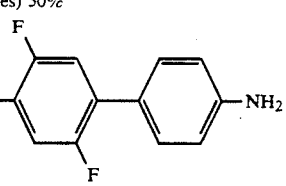<br>2.1907 g (7.393 mmoles) 50% | Mixed solution of 23.9 g of NMP and 24.0 g of DMAc | 18.0% (54.0 P) |
| 14 | TPDA 4.0846 g (11.03 mmoles) | 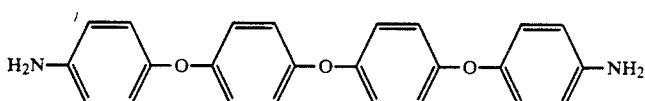<br>1.6949 g (4.409 mmoles) 40% | Mixed solution of 20.3 g of NMP and 20.3 g of DMAc | 16.0% (45.7 P) |

TABLE 5-continued

Compositions of polymers Examples 13 to 22

| Example No. | Acid dianhydride component | Diamine component | Solvent | Solid concentration (Final viscosity) |
|---|---|---|---|---|
| | | 2,2'-difluoro-4,4''-diamino-p-terphenyl<br>1.9599 g (6.614 mmoles) 60% | | |
| 15 | TPDA<br>5.6770 g<br>(15.33 mmoles) | H₂N–C₆H₄–O–C₆H₄–O–C₆H₄–O–C₆H₄–NH₂<br>1.7680 g (4.599 mmoles) 30%<br><br>2,2'-difluoro-4,4''-diamino-p-terphenyl<br>3.1795 g (10.73 mmoles) 70% | Mixed solution of 25.9 g of NMP and 25.9 g of DMAc | 17.0% (35.0 P) |
| 16 | TPDA<br>5.5400 g<br>(14.96 mmoles) | H₂N–C₆H₄–O–C₆H₄–C₆H₄–O–C₆H₄–NH₂<br>2.7552 g (7.478 mmoles) 50%<br><br>2,2'-difluoro-4,4''-diamino-p-terphenyl<br>2.2159 g (7.478 mmoles) 50% | Mixed solution of 29.8 g of NMP and 28.8 g of DMAc | 15.0% (39.8 P) |
| 17 | TPDA<br>4.1217 g<br>(11.13 mmoles) | H₂N–C₆H₄–O–C₆H₄–C₆H₄–O–C₆H₄–NH₂<br>1.6617 g (4.451 mmoles) 40%<br><br>2-fluoro-4,4''-diamino-p-terphenyl<br>1.9782 g (6.676 mmoles) 60% | Mixed solution of 20.4 g of NMP and 20.4 g of DMAc | 16.0% (40.3 P) |
| 18 | TPDA<br>4.1884 g<br>(11.31 mmoles) | H₂N–C₆H₄–O–C₆H₄–C₆H₄–O–C₆H₄–NH₂<br>1.2501 g (3.393 mmoles) 30% | Mixed solution of 19.0 g of NMP and 19.0 g of DMAc | 17.0% (45.1 P) |

TABLE 5-continued

Compositions of polymers Examples 13 to 22

| Example No. | Acid dianhydride component | Diamine component | Solvent | Solid concentration (Final viscosity) |
|---|---|---|---|---|
| | | [structure: 4,4'-diamino-2,2'-difluoro-p-terphenyl]  2.3461 g (7.917 mmoles) 70% | | |
| 19 | TPDA 4.1217 g (11.13 mmoles) | [structure: H₂N–C₆H₄–O–C₆H₄–C(CH₃)₂–C₆H₄–O–C₆H₄–NH₂]  2.2846 g (5.565 mmoles) 50%  [structure: 4,4'-diamino-2,2',3,3'-tetrafluoro-p-terphenyl]  1.8493 g (5.565 mmoles) 50% | Mixed solution of 21.7 g of NMP and 21.7 g of DMAc | 16.0% (38.9 P) |
| 20 | TPDA 4.1218 g (11.13 mmoles) | [structure: H₂N–C₆H₄–O–C₆H₄–C(CH₃)₂–C₆H₄–O–C₆H₄–NH₂]  1.8277 g (4.452 mmoles) 40%  [structure: tetrafluoro-p-terphenyl diamine]  2.2192 g (6.678 mmoles) 60% | Mixed solution of 23.1 g of NMP and 23.1 g of DMAc | 15.0% (45.6 P) |
| 21 | TPDA 4.1217 g (11.13 mmoles) | [structure: H₂N–C₆H₄–O–C₆H₄–C(CH₃)₂–C₆H₄–O–C₆H₄–NH₂]  1.3708 g (3.339 mmoles) 30%  [structure: tetrafluoro-p-terphenyl diamine]  2.5890 g (7.791 mmoles) 70% | Mixed solution of 22.9 g of NMP and 22.9 g of DMAc | 15.0% (39.9 P) |
| 22 | TPDA 4.0000 g (10.80 mmoles) | [structure: H₂N–C₆H₄–O–C₆H₄–O–C₆H₄–O–C₆H₄–NH₂]  1.6612 g (4.321 mmoles) 40% | Mixed solution of 21.3 g of NMP and 21.3 g of DMAc | 17.0% (34.7 P) |

TABLE 5-continued

Compositions of polymers Examples 13 to 22

| Example No. | Acid dianhydride component | Diamine component | Solvent | Solid concentration (Final viscosity) |
|---|---|---|---|---|

H₂N—⟨phenyl⟩—⟨C₆F₄⟩—⟨C₆F₄⟩—⟨phenyl⟩—NH₂ (octafluoro-p-quaterphenyl diamine)

2.9053 g (6.048 mmoles) 56%
$H_2N-(CH_2)_3-Si(OC_2H_5)_2-CH_3$
0.165 g (0.864 mmoles) 4%
(in terms of diamine)

TABLE 6

Characteristics of polyimide films Examples 1 to 10

| Example No. | Reduced viscosity (dl/g) | ε (10 kHz 25° C.) | Td (°C.) | Tg (°C.) | α (ppm/°C.) | Tensile strength (kg/mm²) | Young's modulus (kg/mm²) | Elongagation (%) |
|---|---|---|---|---|---|---|---|---|
| 13 | 1.71 | 2.6 | 540 | 380 | 23 | 15 | 380 | 15 |
| 14 | 1.69 | 2.6 | 520 | 395 | 20 | 17 | 510 | 16 |
| 15 | 1.82 | 2.6 | 530 | 400 | 18 | 19 | 610 | 12 |
| 16 | 1.19 | 2.6 | 550 | 365 | 24 | 20 | 490 | 16 |
| 17 | 1.72 | 2.6 | 530 | 390 | 21 | 21 | 530 | 18 |
| 18 | 1.67 | 2.6 | 520 | 380 | 16 | 22 | 640 | 16 |
| 19 | 1.54 | 2.6 | 510 | 350 | 27 | 16 | 340 | 18 |
| 20 | 1.68 | 2.6 | 510 | 370 | 22 | 18 | 490 | 13 |
| 21 | 1.46 | 2.6 | 510 | 380 | 18 | 21 | 630 | 12 |
| 22 | 1.63 | 2.6 | 510 | 390 | 19 | 16 | 580 | 16 |

EXAMPLE 23

In 50.0 g (solid concentration: 17%) of a 1:1 mixed solvent of N,N-dimethylacetamide (DMAc) and N-methyl-2-pyrolidone (NMP) were dissolved 3.494 g (6.740 mmoles, 50% by mole based on the total number of moles of the diamine components) of 2,2-bis[4-(p-aminophenoxy)-phenyl]hexafluoropropane and 1.755 g (6.740 mmoles, 50% mole based on the total number of moles of the diamine components) of 4,4''-diamino-p-terphenyl with stirring at room temperature in a nitrogen stream. Then, 4.992 g (13.48 mmoles) of p-terphenyl-3,3'',4,4''-tetracarboxylic acid dianhydride (TPDA) was dissolved in the resulting solution with stirring in a nitrogen stream. In this case, the temperature of the solution rose to about 30° C. and its viscosity became 120 poise. The solution thus obtained was heated at 60° to 70° C. for about 5 hours to adjust the viscosity to 50 poise, whereby a poly(amic acid) varnish was obtained. The varnish was diluted to adjust the concentration to 0.1 g/100 ml with N-methyl-2-pyrolidone. The viscosity of the dilution was measured at 25° C. with a Ubbelohde viscometer, and the reduced viscosity was determined to be 1.66 dl/g.

The poly(amic acid) varnish was spin-coated on each of a silicon wafer and a glass substrate and cured in a nitrogen stream at 200° C. for 30 minutes and then at 350° C. for 30 minutes. The cured product was peeled from the substrate to obtain a film having a satisfactory flexibility.

Figure 5:
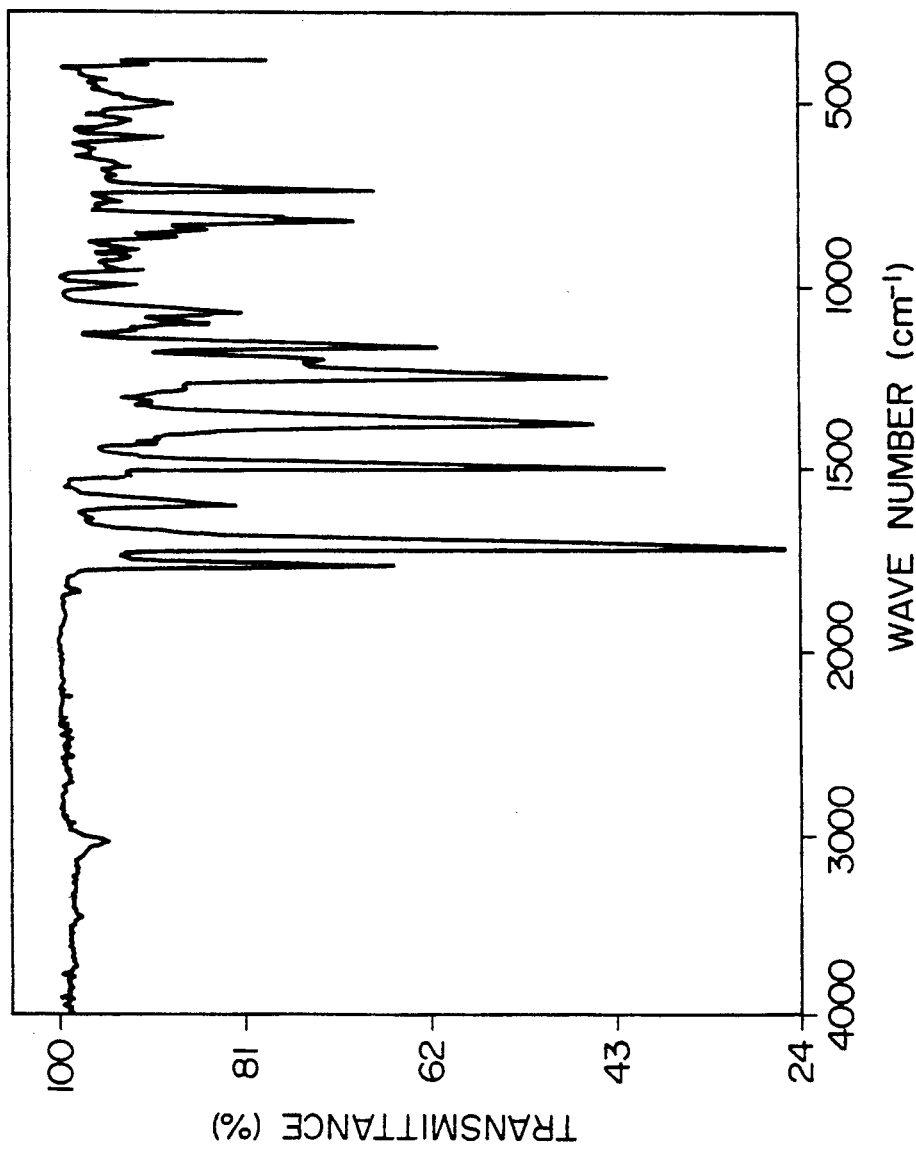
FIG. 5 is an infrared absorption spectrum of a polyimide film obtained in Example 23.

Subsequently, the characteristic values of the film was evaluated. Table 7 shows the composition of the polymer, and Table 8 the evaluation results. FIG. 5 shows an infrared absorption spectrum of the polyimide film.

EXAMPLES 24 and 25

Polyimide films were formed in the same manner as in Example 23, except for using each combination of the components listed in Table 7. The characteristics of the films were evaluated in the same manner as in Example 23. The results obtained are shown in Table 8. The polyimide films had a high flexibility and were satisfactory in all the characteristics.

EXAMPLE 26

In 40.0 g (solid concentration: 17.1%) of a 1:1 mixed solvent of N,N-dimethylacetamide (DMAc) and N-methyl-2-pyrolidone (NMP) were dissolved 2.323 g (4.4800 mmoles, 40% by mole based on the total number of moles of the diamine components) of 2,2-bis[4-(p-aminophenoxy)phenyl]hexafluoropropane, 1.633 9 (6.272 mmoles, 56% by mole based on the total number of moles of the diamine components) of 4,4''-diamino-p-terphenyl, and 0.171 g (0.896 mmoles, 4% by mole (in terms of diamine) based on the total number of moles of the diamine components) of 3-aminopropylmethyldimethoxysilane with stirring at room temperature in a nitrogen stream. Then, 4.148 g (11.20 mmoles) of p-terphenyl-3,3'',4,4''-tetracarboxylic acid dianhydride (TPDA) was dissolved in the resulting solution with stirring in a nitrogen stream. In this case, the temperature of the solution rose to about 30° C. and its viscosity became 80 poise. The solution thus obtained was heated at 60° to 70° C. for about 5 hours to adjust the viscosity to 38.3 poise, whereby a poly(amic acid) varnish was obtained.

The poly(amic acid) varnish was spin-coated on a silicon wafer and cured in a nitrogen stream at 20° C. for 30 minutes and at 350° C. for 30 minutes. Thereafter, the polyimide film thus formed was tried to be peeled from the wafer but was difficult to peel, indicating that the film was very excellent in adhesive properties. In addition, a polyimide film was formed on a glass substrate in the same manner as in Example 23 and its characteristic values were evaluated in the same manner as in Example 23. The results obtained are shown in Table 8.

TABLE 7

Compositions of polymers Examples 23 to 26

| Example No. | Acid dianhydride component | Diamine component | Solvent | Solid concentration (Final viscosity) (Reduced viscosity) |
|---|---|---|---|---|
| 23 | TPDA 4.992 g (13.48 mmoles) | 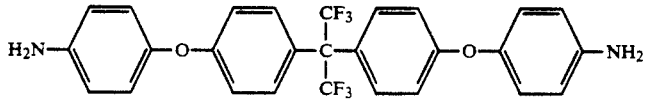 3.494 g (6.740 mmoles) 50% <br><br>  1.755 g (6.740 mmoles) 50% | Mixed solution of 25.0 g of NMP and 25.0 g of DMAc | 17.0% (50.0 P) (1.66 dl/g) |
| 24 | TPDA 4.148 g (11.20 mmoles) | 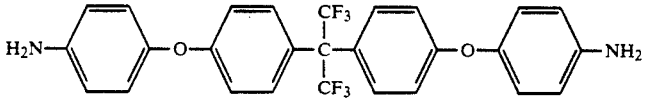 2.323 g (4.480 mmoles) 40% <br><br>  1.750 g (6.721 mmoles) 60% | Mixed solution of 20.1 g of NMP and 20.1 g of DMAc | 17.0% (48.3 P) (1.63 dl/g) |
| 25 | TPDA 4.148 g (11.20 mmoles) | 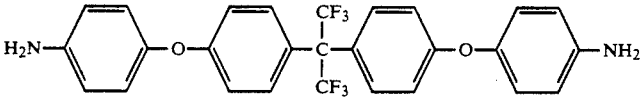 1.742 g (3.360 mmoles) 30% <br><br>  2.041 g (7.841 mmoles) 70% | Mixed solution of 19.4 g of NMP and 19.4 g of DMAc | 17.1% (49.1 P) (1.64 dl/g) |
| 26 | TPDA 4.148 g (11.20 mmoles) | 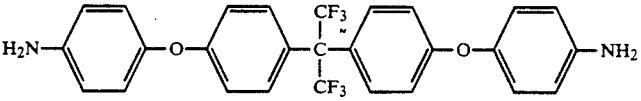 2.323 g (4.480 mmoles) 40% <br><br>  1.633 g (6.272 mmoles) 56% <br><br> $H_2N-(CH_2)_3-Si(OC_2H_5)_2-CH_3$ 0.171 g (0.896 mmoles) 4% | Mixed solution of 20.0 g of NMP and 20.0 g of DMAc | 17.1% (38.3 P) (1.50 dl/g) |

TABLE 8

Characteristics of polyimide films
Examples 23 to 26

| Example No. | ε (10 kHz 25° C.) | Td (°C.) | Tg (°C.) | α (ppm/°C.) | Tensile strength (kg/mm$^2$) | Young's modulus (kg/mm$^2$) | Elongagation (%) |
| --- | --- | --- | --- | --- | --- | --- | --- |
| 23 | 2.6 | 500 | 350 | 25 | 14 | 380 | 23 |
| 24 | 2.6 | 510 | 360 | 20 | 17 | 430 | 17 |
| 25 | 2.6 | 530 | 380 | 17 | 21 | 490 | 12 |
| 26 | 2.6 | 510 | 360 | 19 | 17 | 440 | 15 |

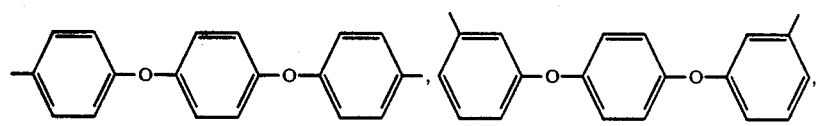
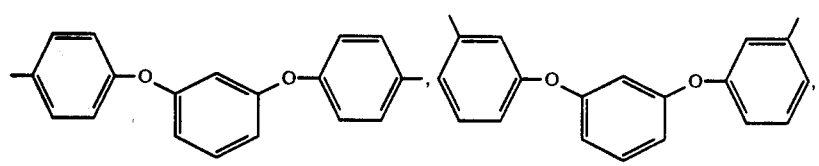
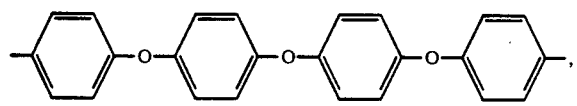
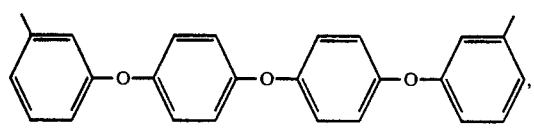
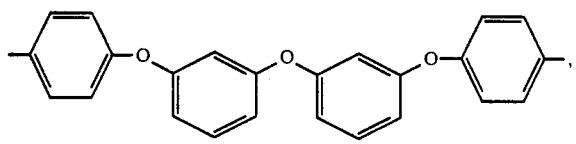
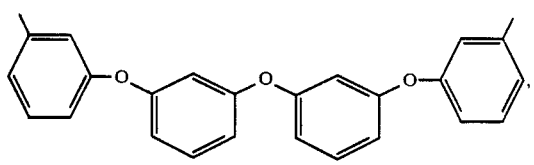
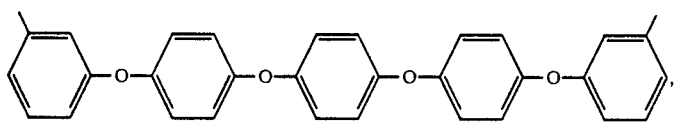
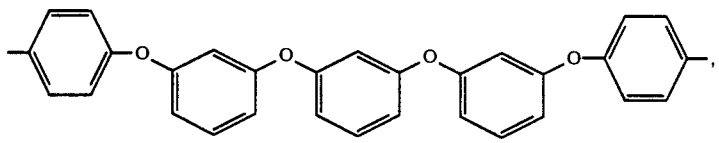
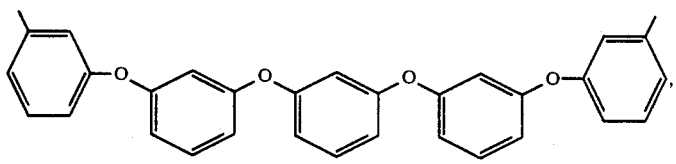
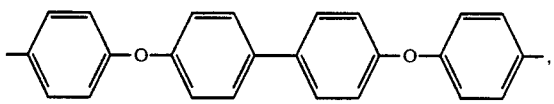

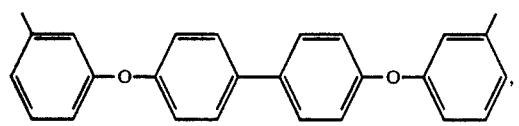
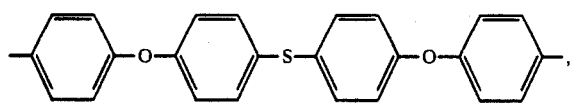
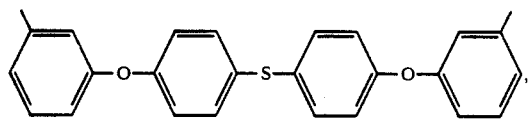
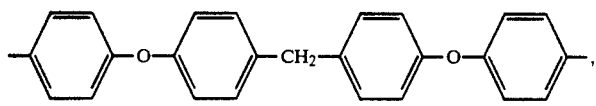
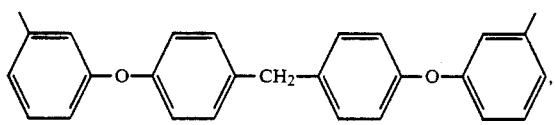
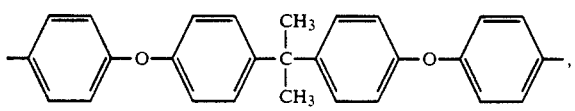
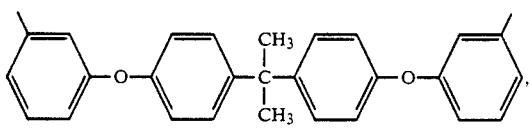
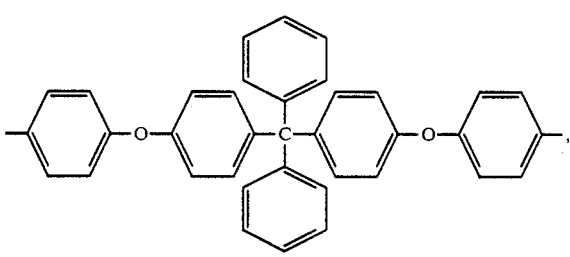
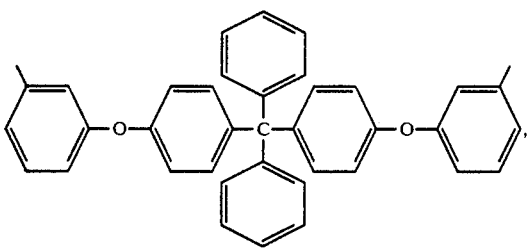
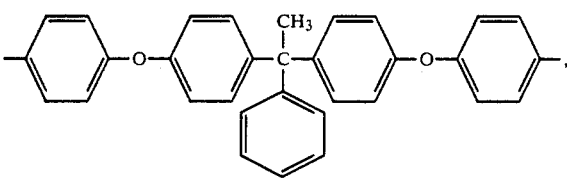

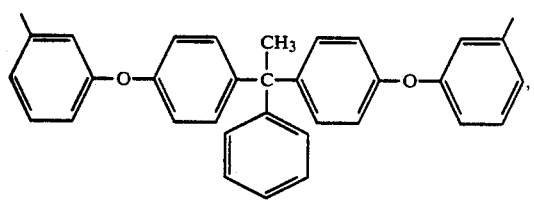
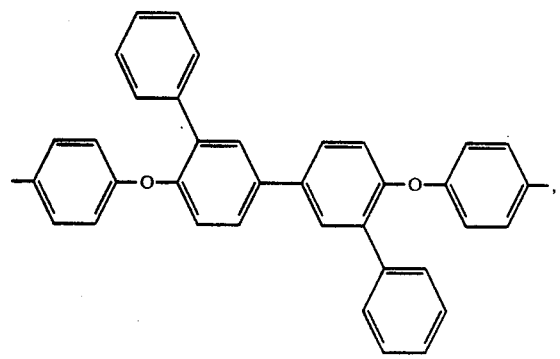
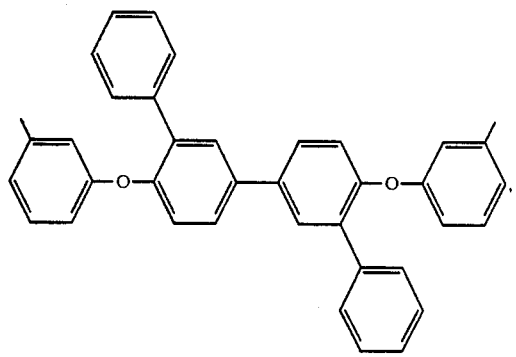
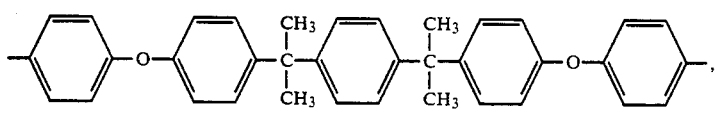
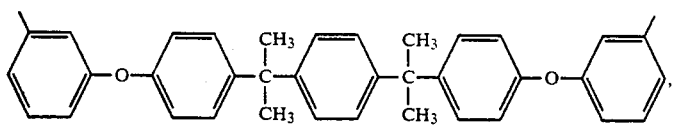
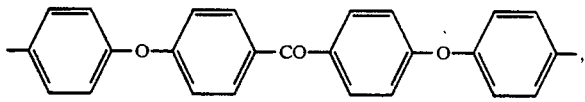
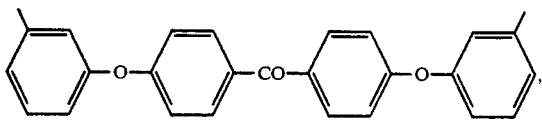
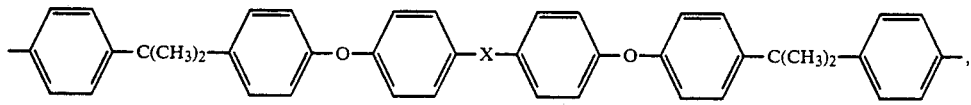

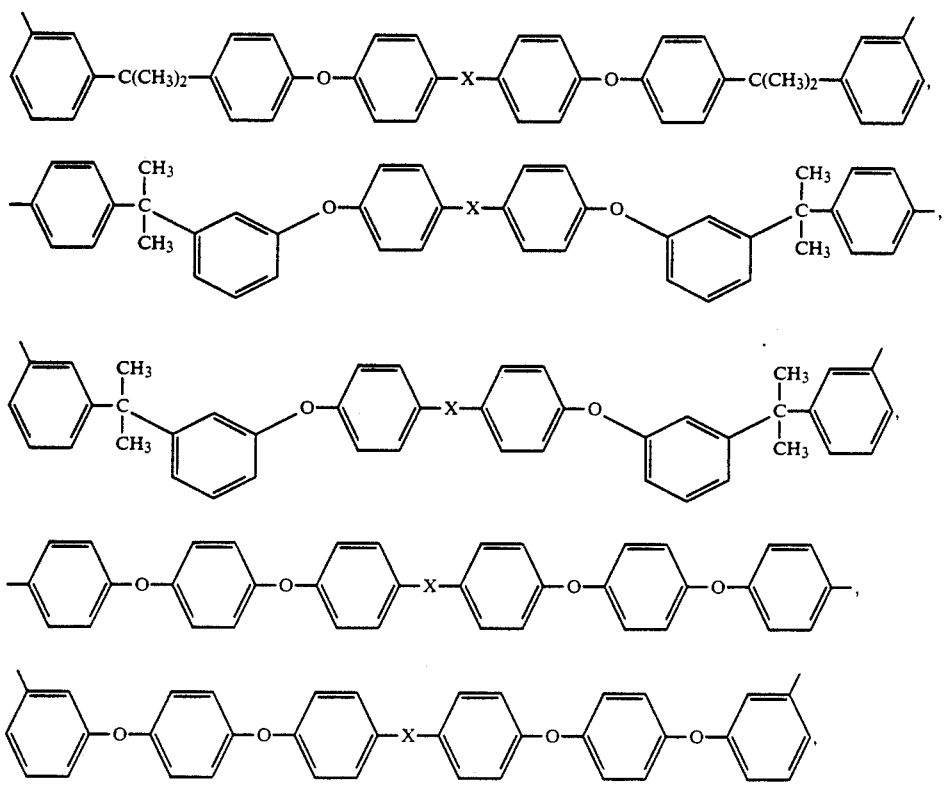
(wherein X is —O—, —S—, —C(CH$_3$)$_2$—, —CH$_2$—, —C(CF$_3$)$_2$—, —C(C$_6$H$_5$)$_2$—, —C(C$_6$H$_5$)(CH$_3$)— or —CO—
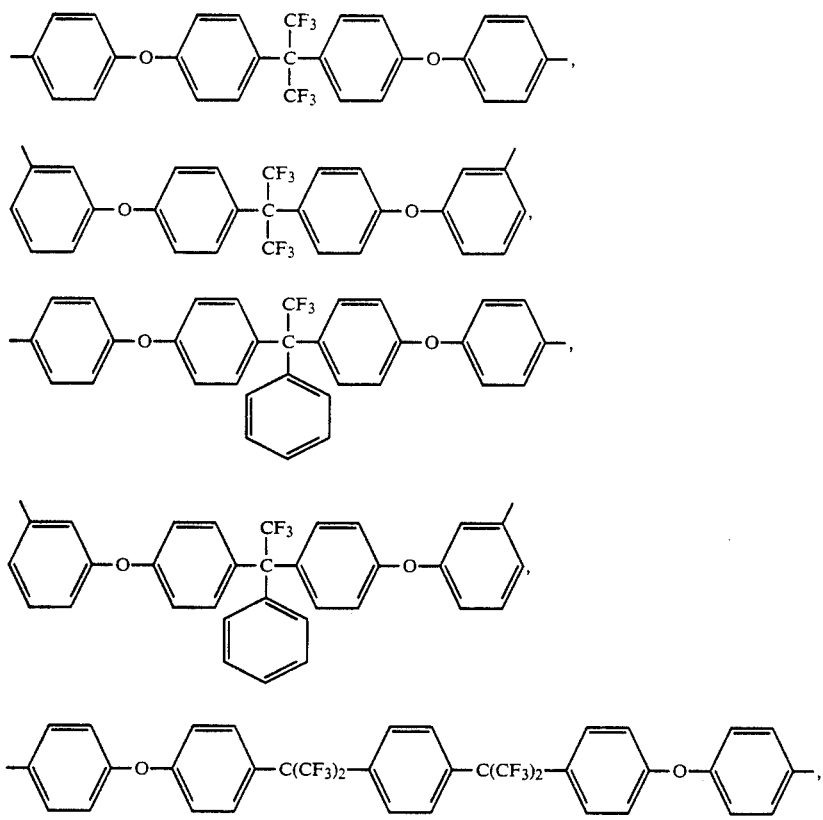

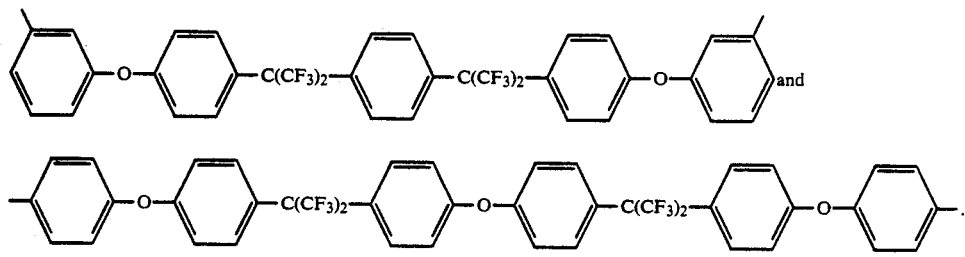

What is claimed is:

1. A polyimide precursor whose molecular chain comprises repeating units represented by the following general formula (1) and repeating units represented by the following general formula (2):

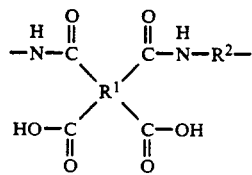

(1)

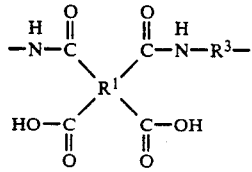

(2)

wherein $R^1$ is at least one kind of tetravealent organic group selected from the group consisting of

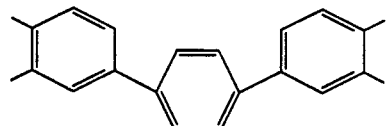

and

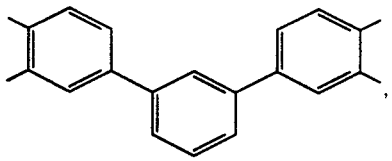

$R^2$ is at least one kind of divalent organic group having a linear structure which is selected from the group consisting of

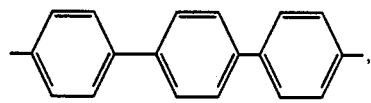

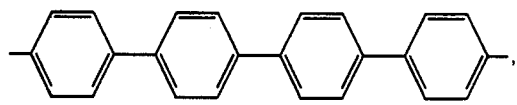

-continued

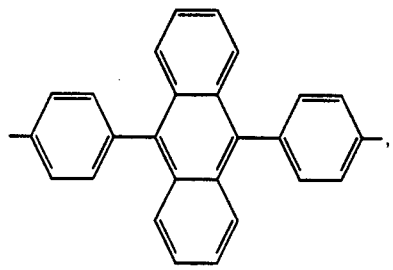

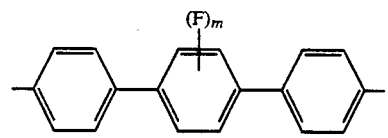

and

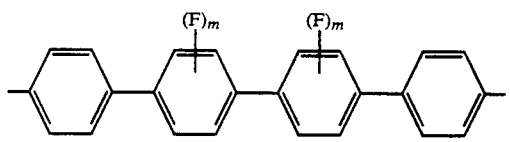

m is an integer of 1 to 4, and $R^3$ is a divalent organic group having a non-linear structure which contains at least two aromatic rings.

2. A polyimide precursor according to claim 1, wherein when the sum of the number of the divalent organic groups of a linear structure represented by —$R^2$— in the general formula (1) and the number of the divalent organic groups of a non-linear structure represented by —$R^3$— in the general formula (2) is taken as 100, the number of the organic groups represented by —$R^2$— is 30 to 80 and the number of the organic groups represented by —$R^3$— is 70 to 20.

3. A polyimide precursor whose molecular chain comprises repeating units represented by the following general formula (1), repeating units represented by the following general formula (2), and repeating units represented by the following general formula (3):

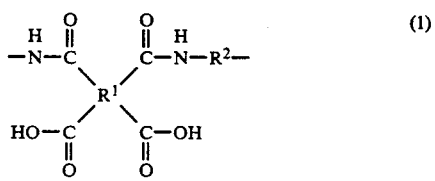

(1)

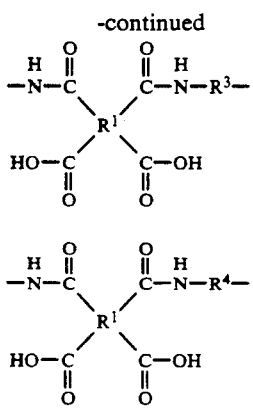

wherein R¹ is at least one kind of tetravalent organic group selected from the group consisting of

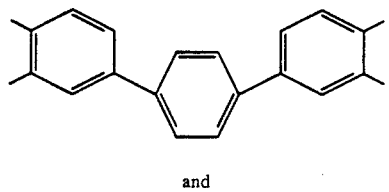

and

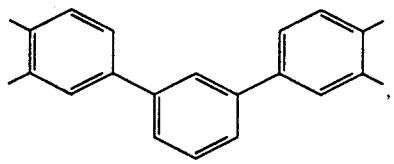

R² is at least one kind of divalent organic group having a linear structure which is selected from the group consisting of

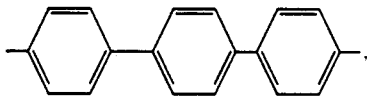

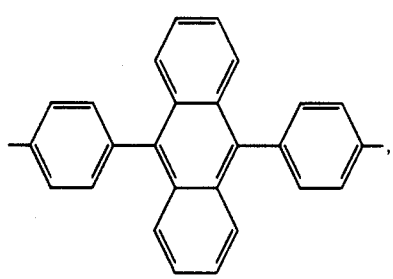

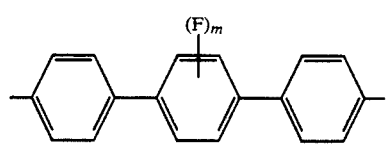

and

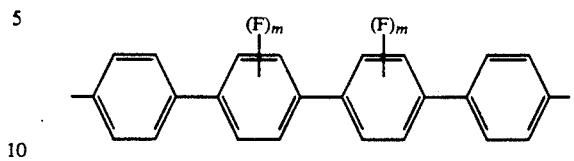

m is an integer of 1 to 4, R³ is a divalent organic group having a non-linear structure which contains at least two aromatic rings, and R⁴ is a hydrocarbon group containing 1 to 3 silicon atoms which is represented by the following general formula (4) or the following general formula (5) when R⁴ is at the end of or in the main chain, respectively, of the polymer;

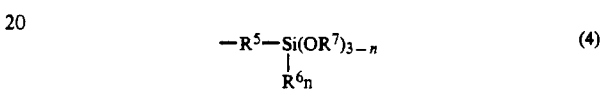

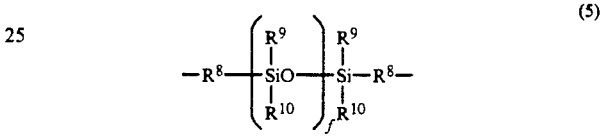

wherein each of $R^5$ and $R^8$ is a hydrocarbon group having 1 to 9 carbon atoms or a saturated alkyl group having 1 to 7 carbon atoms which contains an ether linkage; $R^6$ is a hydrocarbon group having 1 to 3 carbon atoms; $R^7$ is at least one member selected from the group consisting of an alkyl group having 1 to 5 carbon atoms, a trialkylsilyl group with each alkyl having 1 to 5 carbon atoms, and an alkoxyalkyl group having 2 to 5 carbon atoms; each of $R^9$ and $R^{10}$ is at least one kind of group selected from the group consisting of alkyl groups having 1 to 3 carbon atoms, and aryl groups having 1 to 9 carbon atoms; n is an integer of 0 to 3; and f is 1 or 2.

4. A polyimide precursor according to claim 3, wherein when the sum of the number of the divalent organic groups of a linear structure represented by —R²— in the general formula (1), the number of the divalent organic groups of a non-linear structure represented by —R³— in the general formula (2) and the number of the hydrocarbon groups represented by —R⁴— is taken as 100, the number of the organic groups represented by —R²— is 30 to 80, the number of the organic groups represented by —R³— is 70 to 20, and the number of the hydrocarbon groups represented by —R⁴— is 0.1 to 10.

5. A polyimide precursor comprising repeating units having a linear structure which contain three or more aromatic rings, and repeating units having a non-linear structure.

6. A polyimide precursor according to claim 1, 2, 3 or 4, wherein the divalent organic group(s) of a non-linear structure represented by —R³— in the general formula (2) are at least one member selected from the group consisting of divalent organic groups represented by the following structural formulas:

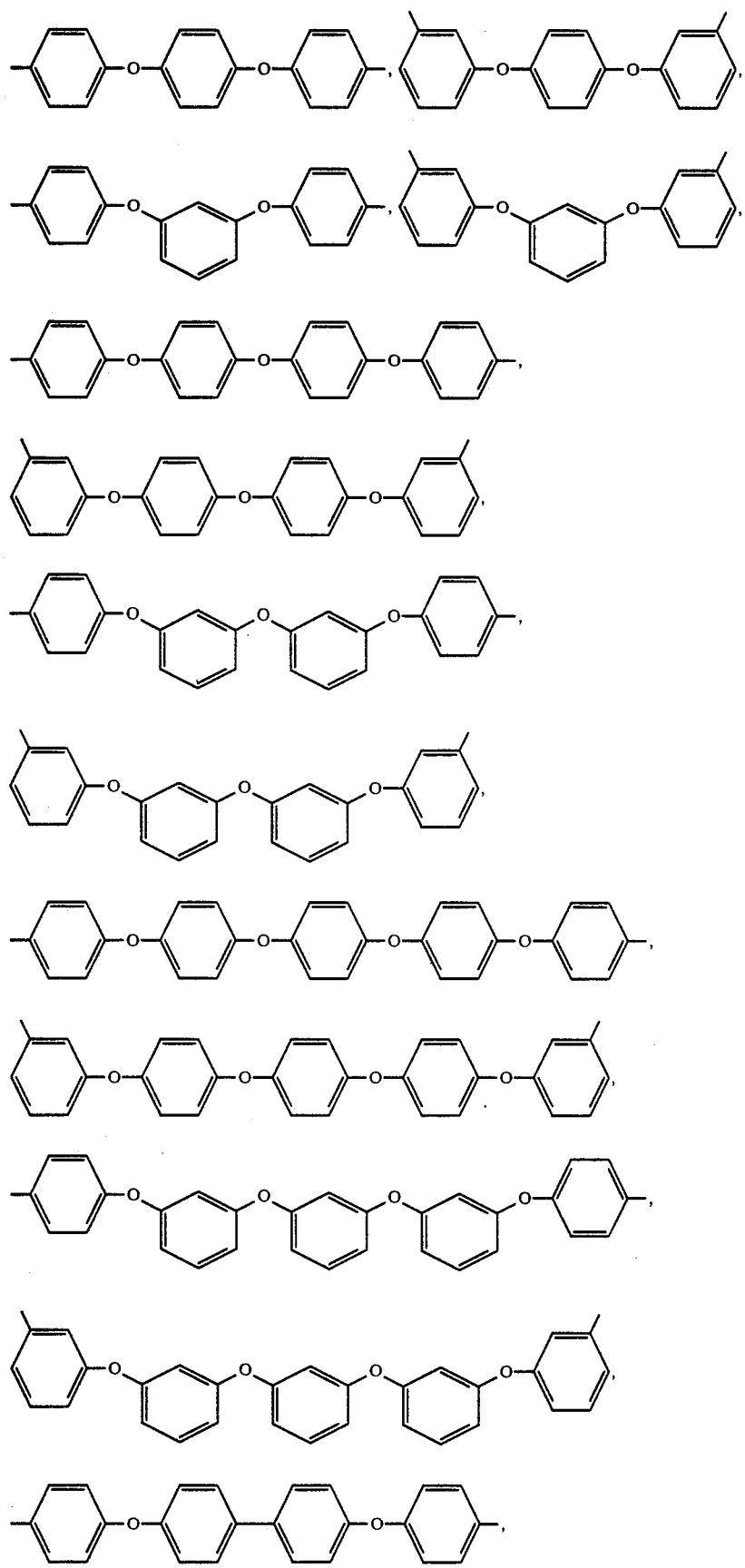

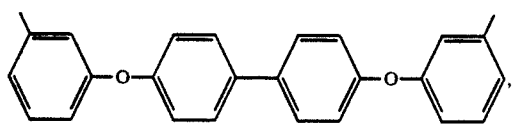
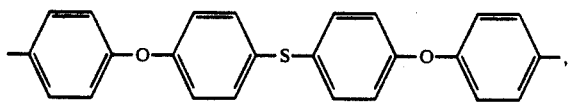
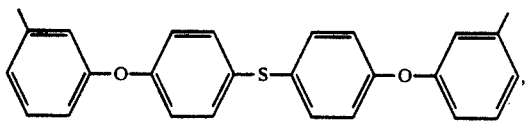
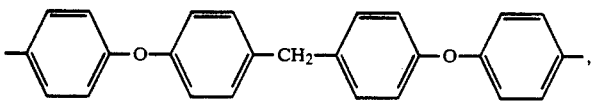
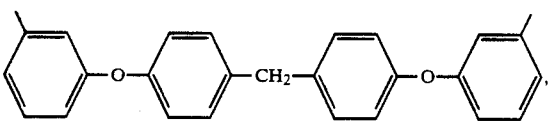
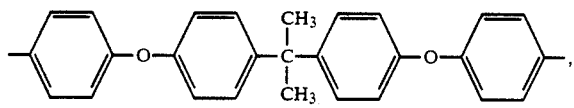
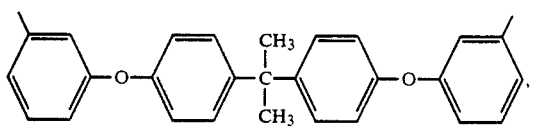
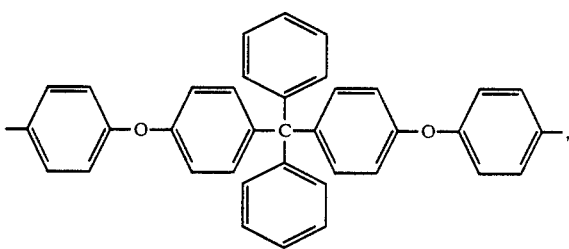
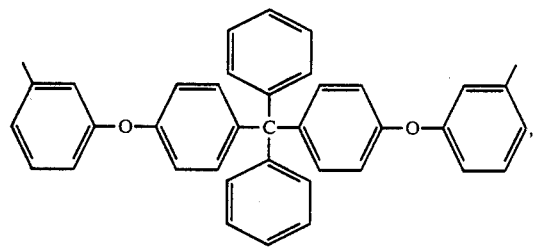
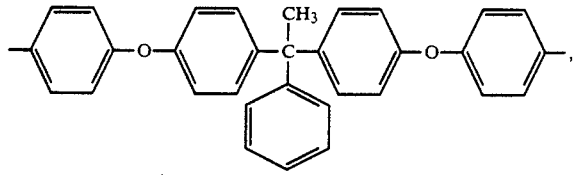

-continued
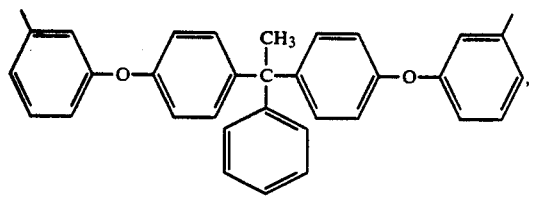
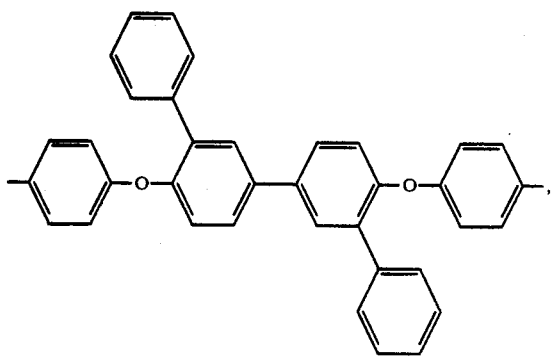
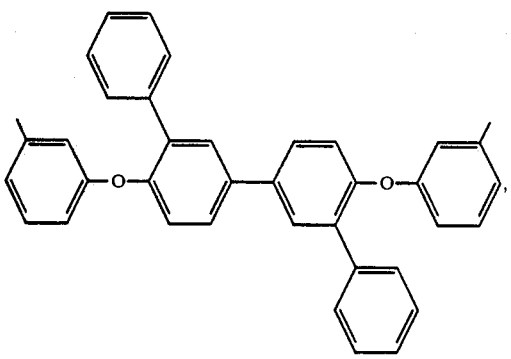
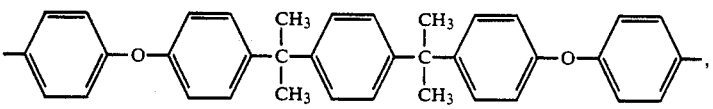
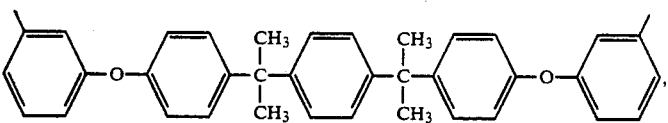
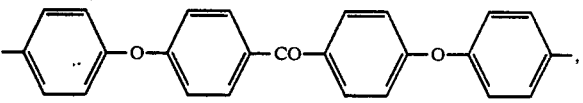
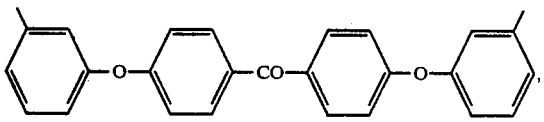
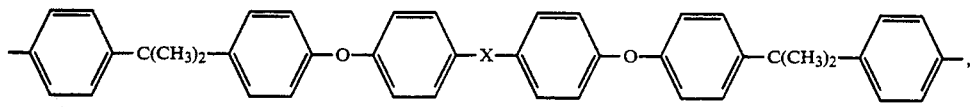

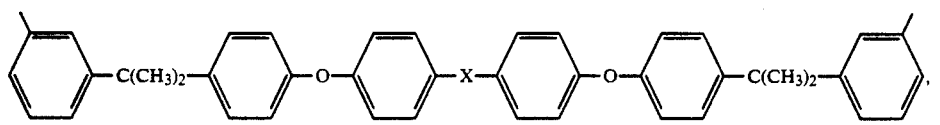
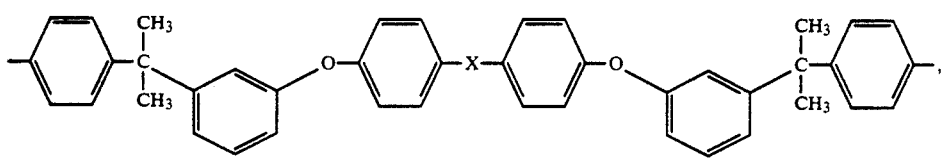
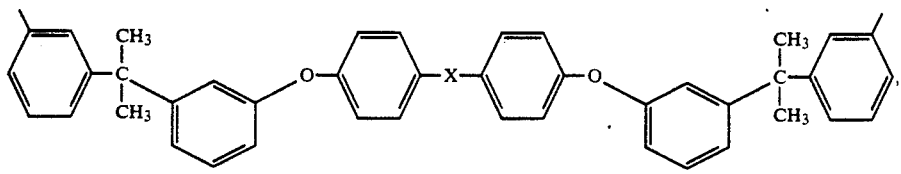
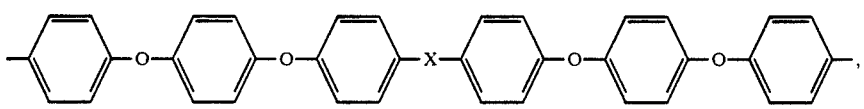
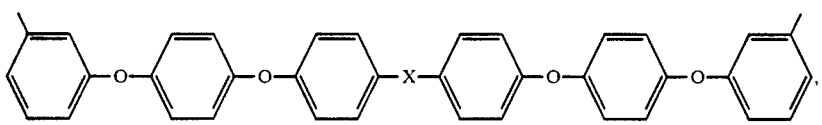
(wherein X is —O—, —S—, —C(CH₃)₂—, —CH₂—, —C(CF₃)₂—, —C(C₆H₅)₂—, —C(C₆H₅)(CH₃)— or —CO—)
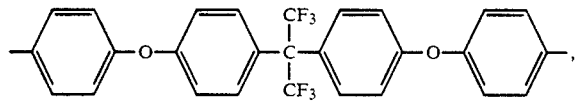
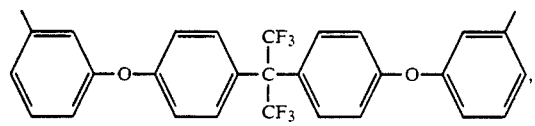
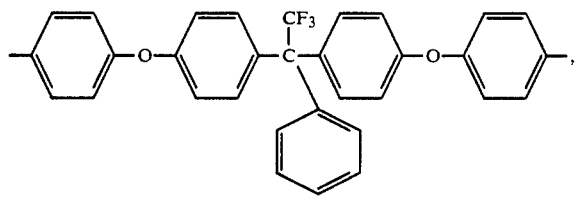
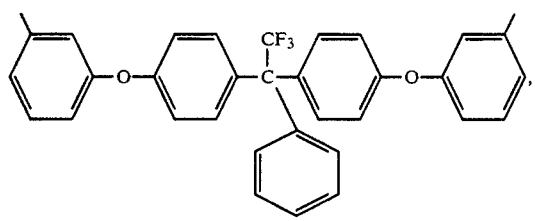

-continued

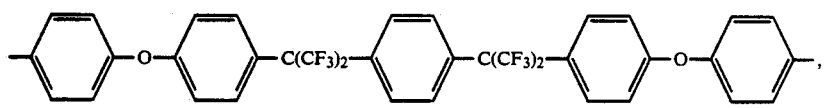

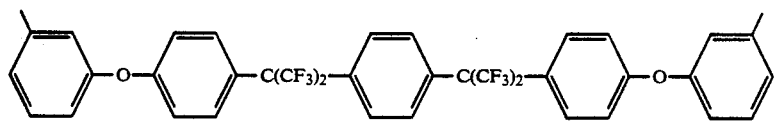

and

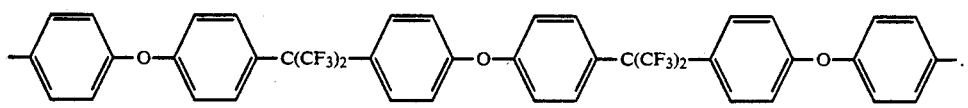

7. A polyimide cured product obtained by heat-curing a polyimide precursor according to claim 1, 2, 3, 4 or 6 at a temperature of 100° C. or higher.

8. A polyimide cured product comprising repeating units having a linear structure which contain three or more aromatic rings and, repeating units having a non-linear structure.

9. A process for producing a polyimide precursor from a tetracarboxylic acid dianhydride and at least two diamine components, which comprises subjecting a tetracarboxylic acid dianhydride represented by the general formula (6):

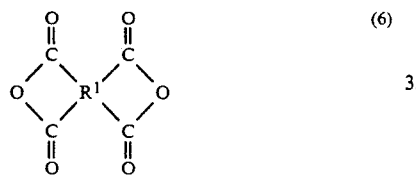

(6)

(wherein $R^1$ is at least one kind of tetravalent organic group selected from the group consisting of

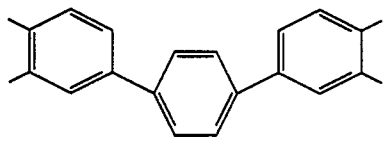

and

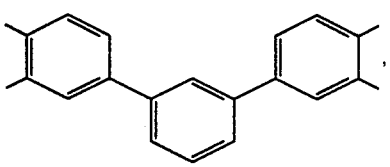

and the diamine components to polymerization in at least one solvent selected from the group consisting of N-methyl-2-pyrolidone, N,N-dimethylacetamide, N,N-dimethylformamide, dimethyl sulfoxide, hexamethylphosphoramide, tetramethylene sulfone, p-chlorophenol and p-bromophenol at a temperature of 0° to 30° C., followed by heating with stirring at 50° to 80° C., wherein the diamine components comprise 1) 30 to 80 parts by mole of a diamine represented by the general formula $H_2—N—R^2—NH_2$ (wherein $R_2$ is at least one kind of divalent organic group having a linear structure which is selected from the group consisting of

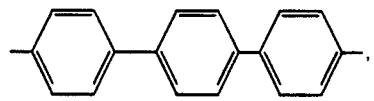

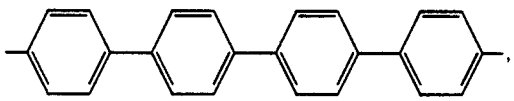

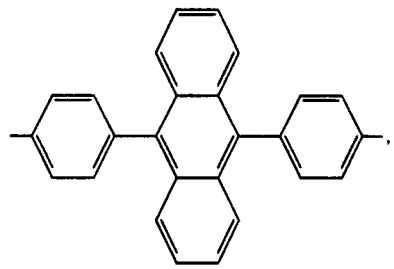

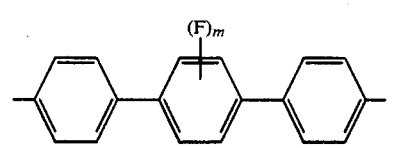

and

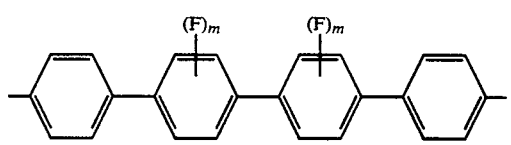

and m is an integer of 1 to 4) and 2) 70 to 20 parts by mole of a diamine represented by the general formula $H_2—N—R^3—NH_2$ (wherein $R^3$ is a divalent organic group having a non-linear structure which contains at least two aromatic rings), the total amount of the diamines used being taken as 100 parts by mole.

10. A process of producing a polyimide precursor from a tetracarboxylic acid dianhydride and at least two diamine components, which comprises subjecting a tetracarboxylic acid dianhydride represented by the general formula (6):

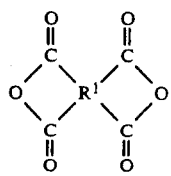 (6)

(wherein R¹ is at least one kind of tetravalent organic group selected from the group consisting of

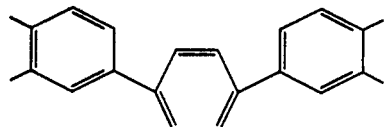

and

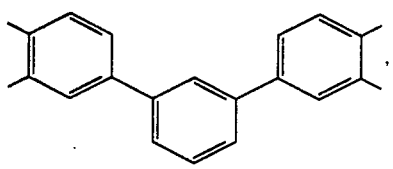, and the diamine components to polymerization in at least one solvent selected from the group consisting of N-methyl-2-pyrolidone, N,N-dimethylacetamide, N,N-dimethylformamide, dimethyl sulfoxide, hexamethylphosphoramide, tetramethylene sulfone, p-chlorophenol and p-bromophenol at a temperature of 0° to 30° C., followed by heating with stirring at 50° to 80° C., wherein the diamine components comprise 1) 30 to 80 parts by mole of a diamine (amine I) represented by the general formula H₂—N—R²—NH₂ (wherein R₂ is at least one kind of divalent organic group having a linear structure which is selected from the group consisting of

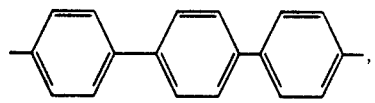,

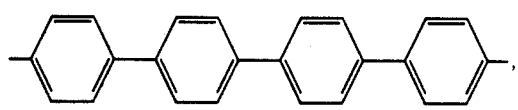,

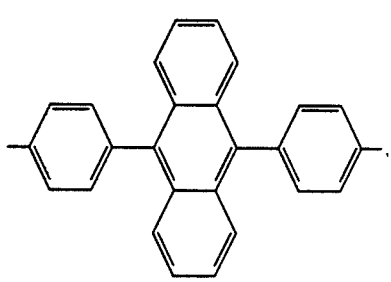,

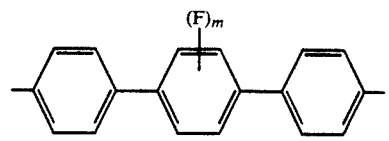

and

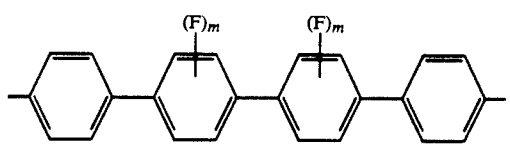

and m is an integer of 1 to 4), 2) 70 to 20 parts by mole of a diamine (amine II) represented by the general formula H₂—N—R³—NH₂ (wherein R³ is a divalent organic group having a non-linear structure which contains at least two aromatic rings), and 3) 0.2 to 20 parts by mole of an aminosilane compound or 0.1 to 10 parts by mole of a siloxane diamine (amine III) which are represented by the following general formula (7) or the following general formula (8), respectively:

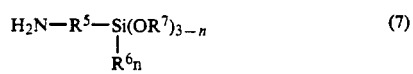 (7)

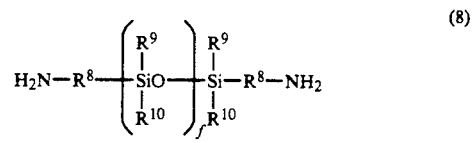 (8)

wherein each of R⁵ and R⁸ is a hydrocarbon group having 1 to 9 carbon atoms or a saturated alkyl group having 1 to 7 carbon atoms which contains an ether linkage; R⁶ is a hydrocarbon group having 1 to 3 carbon atoms; R⁷ is at least one member selected from the group consisting of an alkyl group having 1 to 5 carbon atoms, a trialkylsilyl group with each alkyl having 1 to 5 carbon atoms and an alkoxyalkyl group having 2 to 5 carbon atoms; each of R⁹ and R¹⁰ is at least one kind of group selected from the group consisting of alkyl groups having 1 to 3 carbon atoms, and aryl groups having 1 to 9 carbon atoms; n is an integer of 0 to 3; and f is 1 or 2 the total amount of the amines I, II and III used being taken as 100 parts by mole, with the proviso that when amine III is the aminosilane, the amount of amine III is halved in arriving at the total amount of amines used.

11. A process for producing a polyimide precursor according to claim 9 or 10, wherein the divalent organic group(s) represented by —R³— in the diamine represented by H₂N—R³—NH₂ (wherein R³ is a divalent organic group having a non-linear structure which contains at least two aromatic rings) are at least one member selected from the group consisting of divalent organic groups represented by the following structural formula: